United States Patent
Huang et al.

(10) Patent No.: US 11,870,215 B2
(45) Date of Patent: Jan. 9, 2024

(54) RECONFIGURABLE LASER PULSE GENERATING CIRCUIT

(71) Applicant: Lumentum Operations LLC, San Jose, CA (US)

(72) Inventors: Hao Huang, San Jose, CA (US);
Mikhail Dolganov, Gilroy, CA (US);
Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 369 days.

(21) Appl. No.: 16/912,338

(22) Filed: Jun. 25, 2020

(65) Prior Publication Data

US 2021/0296855 A1    Sep. 23, 2021

Related U.S. Application Data

(60) Provisional application No. 62/993,234, filed on Mar. 23, 2020.

(51) Int. Cl.
*H01S 5/042* (2006.01)
*H01S 5/062* (2006.01)
*G01S 17/10* (2020.01)

(52) U.S. Cl.
CPC .......... *H01S 5/0428* (2013.01); *H01S 5/0425* (2013.01); *G01S 17/10* (2013.01); *H01S 5/06216* (2013.01)

(58) Field of Classification Search
None
See application file for complete search history.

(56) References Cited

U.S. PATENT DOCUMENTS 5,583,351 A * 12/1996 Brown .............. H01L 27/14645
257/443
5,708,676 A *  1/1998 Minamitani ........ H01S 3/09713
372/86

(Continued)

FOREIGN PATENT DOCUMENTS

| CN | 106785891 A | * | 5/2017 | ........... H01S 5/0427 |
| CN | 113725724 A | * | 11/2021 | |
| JP | 2004179591 A | * | 6/2004 | ............. G11B 7/126 |

OTHER PUBLICATIONS

"High Power VCSELs for Gesture Recognition," 2012, Finisar Corporation, Sunnyvale, CA, 5 pages.

*Primary Examiner* — Tod T Van Roy
(74) *Attorney, Agent, or Firm* — Harrity & Harrity, LLP

(57) ABSTRACT

An electrical drive circuit may charge one or more inductive elements, where the electrical drive circuit includes the one or more inductive elements and a capacitive element in series between the one or more inductive elements and the optical load, and where the electrical drive circuit is connected to one or more sources. The electrical drive circuit may generate, after the charging and for a first time interval, a main electrical pulse. The electrical drive circuit may discharge, after the charging and for a second time interval, the one or more inductive elements to provide a compensation electrical pulse, where at least a portion of the second time interval overlaps with the first time interval. The electrical drive circuit may combine the main electrical pulse and the compensation electrical pulse into a combined electrical pulse. The electrical drive circuit may provide the combined electrical pulse to the optical load.

25 Claims, 16 Drawing Sheets

(56) References Cited

U.S. PATENT DOCUMENTS

| | | | | |
|---|---|---|---|---|
| 6,222,862 B1* | 4/2001 | Kinbara | H01S 5/042 | 372/28 |
| 7,075,338 B2* | 7/2006 | Mizuno | H01S 5/042 | 345/82 |
| 7,396,706 B2* | 7/2008 | Sun | B23K 26/0622 | 219/121.69 |
| 7,545,839 B2* | 6/2009 | Giorgi | H01S 5/042 | 372/38.07 |
| 7,912,379 B2* | 3/2011 | Hase | H04B 10/502 | 398/199 |
| 7,947,918 B2 | 5/2011 | Buhler et al. | | |
| 8,599,891 B2* | 12/2013 | Maron | H01S 5/0428 | 372/38.07 |
| 8,619,827 B2* | 12/2013 | Maeda | H01S 5/06216 | 372/38.07 |
| 8,928,715 B2* | 1/2015 | Omori | G03G 15/04072 | 347/237 |
| 9,405,211 B2* | 8/2016 | Fujita | G02B 26/127 | |
| 9,493,765 B2* | 11/2016 | Krishnaswamy | H03K 3/537 | |
| 10,158,211 B2* | 12/2018 | Barnes | H01S 3/10 | |
| 10,673,204 B2* | 6/2020 | Pavlov | G01S 7/4816 | |
| 10,826,268 B1* | 11/2020 | Zamprogno | H01S 5/0428 | |
| 11,418,007 B2* | 8/2022 | Zamprogno | H01S 5/06216 | |
| 2002/0048303 A1* | 4/2002 | Strowitzki | H01S 3/0975 | 372/57 |
| 2002/0181520 A1* | 12/2002 | Iguchi | H01S 5/0427 | 372/43.01 |
| 2003/0016711 A1* | 1/2003 | Crawford | H01S 5/042 | 372/38.02 |
| 2004/0160996 A1* | 8/2004 | Giorgi | H01S 5/042 | 372/25 |
| 2005/0067388 A1* | 3/2005 | Sun | B23K 26/0613 | 219/121.61 |
| 2005/0069002 A1* | 3/2005 | Senga | G11B 7/126 | 372/32 |
| 2005/0243879 A1* | 11/2005 | Horiuchi | H01S 5/042 | 372/38.07 |
| 2006/0126677 A1* | 6/2006 | Sun | B23K 26/067 | 372/30 |
| 2007/0071045 A1* | 3/2007 | Hayashi | H01S 5/042 | 372/38.1 |
| 2007/0273862 A1 | 11/2007 | Barr | | |
| 2010/0087699 A1 | 4/2010 | Peterchev | | |
| 2010/0283322 A1* | 11/2010 | Wibben | H02M 3/158 | 307/31 |
| 2014/0204396 A1 | 7/2014 | Giger et al. | | |
| 2014/0211192 A1* | 7/2014 | Grootjans | H02M 7/42 | 356/5.01 |
| 2017/0070029 A1* | 3/2017 | Moeneclaey | H01S 5/0261 | |
| 2017/0085057 A1* | 3/2017 | Barnes | H01S 5/0428 | |
| 2017/0276771 A1* | 9/2017 | Hayami | G01S 17/10 | |
| 2019/0229493 A1* | 7/2019 | Stern | H01S 5/0428 | |
| 2020/0333438 A1* | 10/2020 | Petrov | H04B 10/50 | |
| 2021/0006034 A1* | 1/2021 | Zamprogno | H01S 5/0428 | |
| 2021/0296855 A1* | 9/2021 | Huang | H01S 3/11 | |
| 2021/0296857 A1* | 9/2021 | Huang | H01S 5/06253 | |
| 2021/0351566 A1* | 11/2021 | Selvanayagam | H01S 5/0428 | |
| 2022/0011410 A1* | 1/2022 | Huang | G01S 7/4865 | |
| 2022/0059983 A1* | 2/2022 | Dolganov | H01S 5/4018 | |
| 2022/0209494 A1* | 6/2022 | Huang | H01S 5/0428 | |
| 2022/0224074 A1* | 7/2022 | Dolganov | H01S 5/0428 | |

* cited by examiner

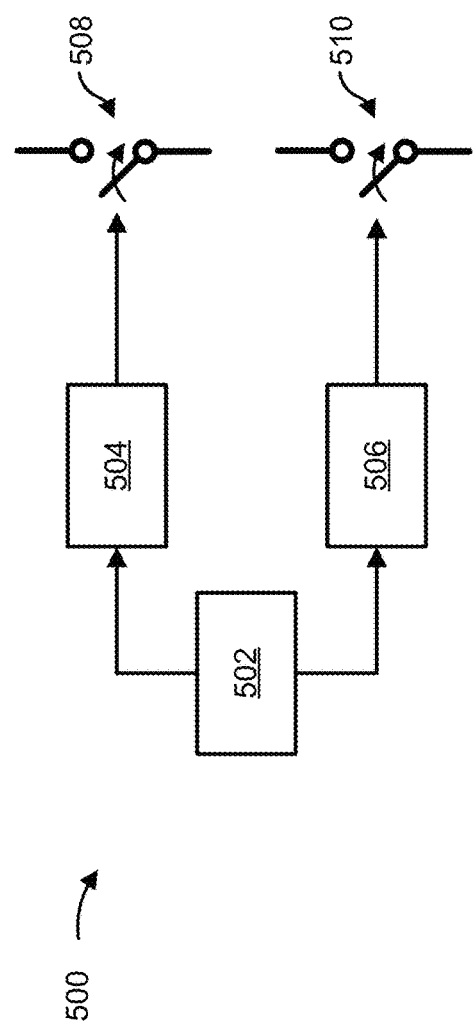
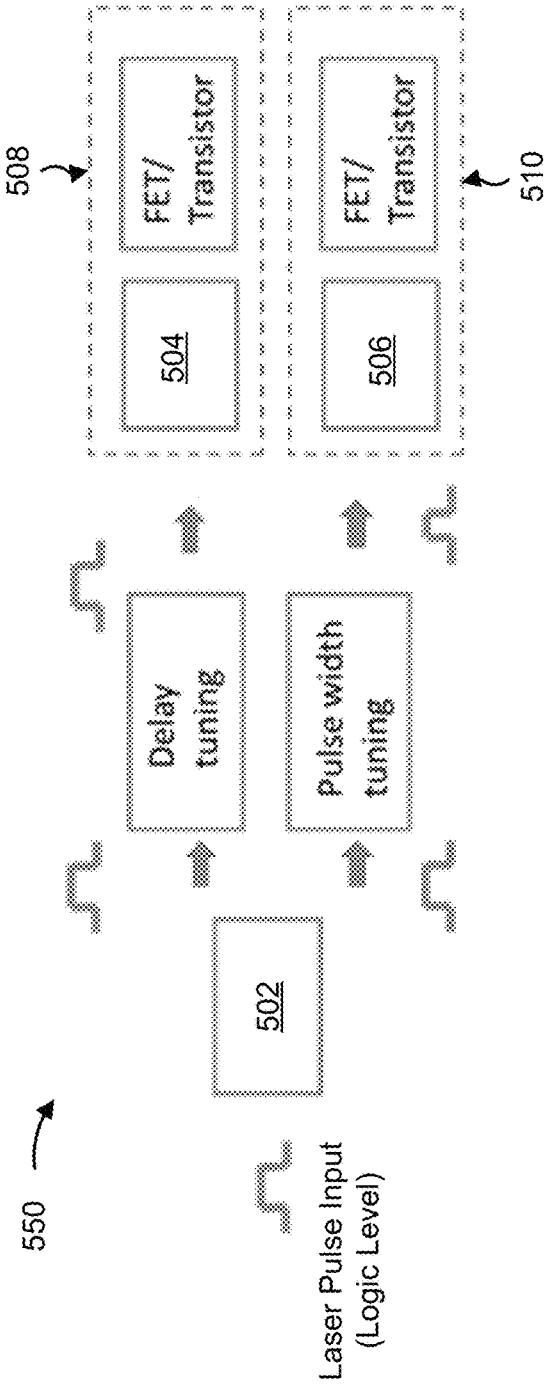
FIG. 5A
FIG. 5B

RECONFIGURABLE LASER PULSE GENERATING CIRCUIT

RELATED APPLICATION

This application claims priority to U.S. Provisional Patent Application No. 62/993,234, for "RECONFIGURABLE LASER PULSE GENERATING CIRCUIT," filed on Mar. 23, 2020, the content of which is incorporated by reference herein in its entirety.

TECHNICAL FIELD

The present disclosure relates generally to electrical drive circuits for optical loads and to methods and electrical drive circuits for generating rectangular-shaped electrical pulses to drive optical loads.

BACKGROUND

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses.

SUMMARY

According to some implementations, a method may include charging, by an electrical drive circuit, one or more inductive elements, wherein the electrical drive circuit includes the one or more inductive elements, wherein the electrical drive circuit includes a capacitive element in series between the one or more inductive elements and an optical load, and wherein the electrical drive circuit is connected to one or more sources; generating, by the electrical drive circuit, after the charging, and for a first time interval, a main electrical pulse; discharging, by the electrical drive circuit, after the charging, and for a second time interval, the one or more inductive elements to provide a compensation electrical pulse, wherein at least a portion of the second time interval overlaps with the first time interval; combining, by the electrical drive circuit, the main electrical pulse and the compensation electrical pulse into a combined electrical pulse; and providing, by the electrical drive circuit, the combined electrical pulse to the optical load.

According to some implementations, an electrical drive circuit for driving an optical load may include a charging circuit path for charging, during a charging time, one or more inductive elements; a main circuit path for generating, in a first time interval after the charging time, a main electrical pulse; and a discharging circuit path for generating, during a second time interval, a compensation electrical pulse by discharging the one or more inductive elements, wherein at least a portion of the second time interval overlaps with the first time interval, and wherein the discharging circuit path includes a capacitive element in series between the one or more inductive elements and the optical load; and wherein the electrical drive circuit is to combine the main electrical pulse and the compensation electrical pulse into a combined electrical pulse, and provide the combined electrical pulse to the optical load.

According to some implementations, an optical device may include one or more sources, an optical load to emit light, an electrical drive circuit connected to the one or more sources and the optical load, wherein the electrical drive circuit includes a charging circuit path for charging one or more inductive elements, a main circuit path for generating a main electrical pulse, and a discharging circuit path for generating a compensation electrical pulse by discharging the one or more inductive elements, wherein the discharging circuit path includes a capacitive element in series between the one or more inductive elements and the optical load, and wherein the electrical drive circuit is to combine the main electrical pulse and the compensation electrical pulse into a combined electrical pulse, and provide the combined electrical pulse to the optical load, and a controller to control the electrical drive circuit to provide the combined electrical pulse to the optical load by causing the charging circuit path to charge the one or more inductive elements for a charging time, causing the main circuit path to generate the main electrical pulse for a first time interval, and causing the discharging circuit path to generate the compensation electrical pulse for a second time interval, wherein at least a portion of the second time interval overlaps with the first time interval, and wherein the optical load is to emit, in response to the combined electrical pulse, an optical pulse.

BRIEF DESCRIPTION OF THE DRAWINGS

FIG. 5A is a diagram of an example implementation of a controller for an electrical drive circuit described herein.

FIG. 5B is a diagram of an example implementation of a process implemented by a controller for an electrical drive circuit described herein.

DETAILED DESCRIPTION

Figure 1:
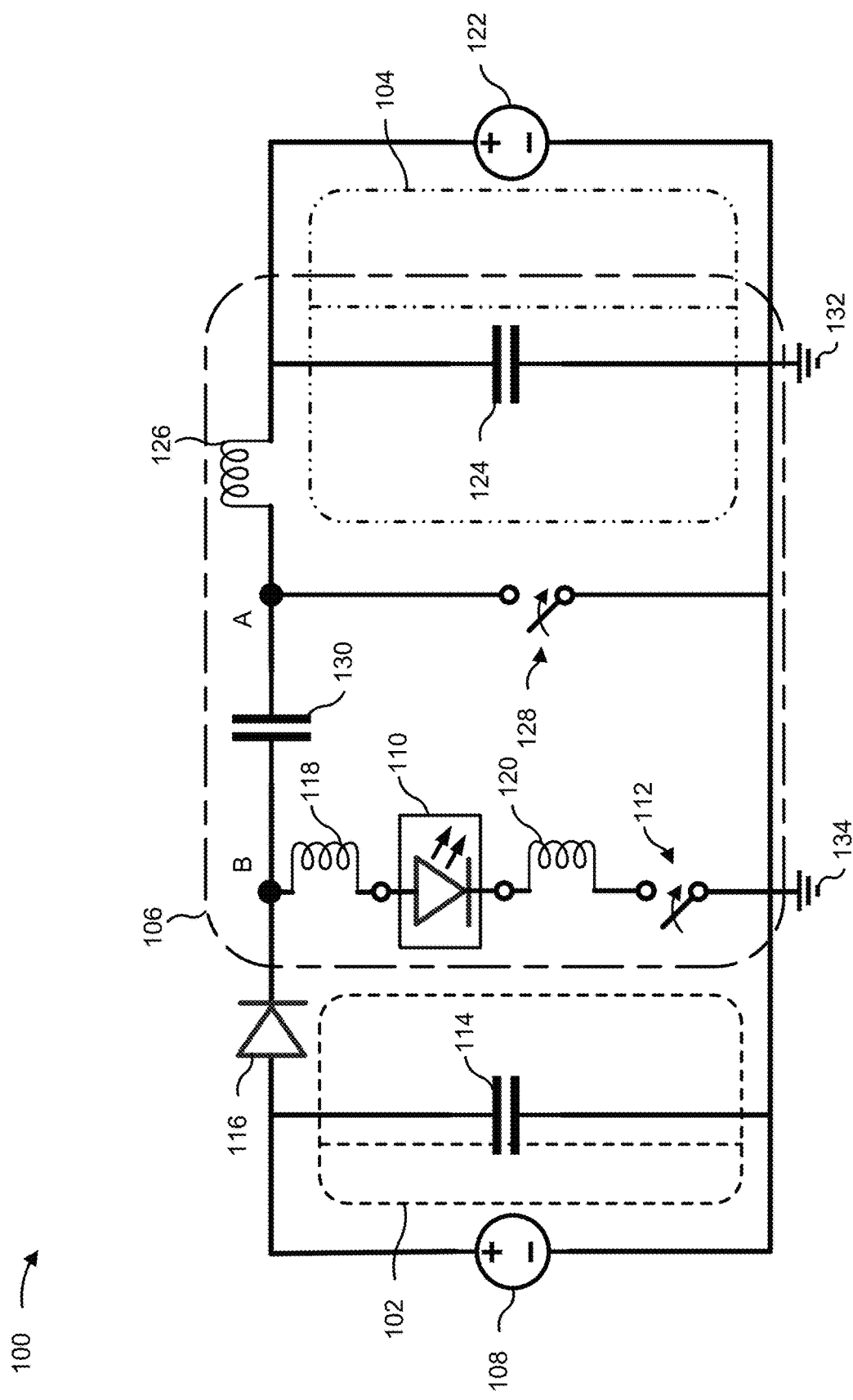
FIGS. 1-4 are circuit diagrams of example implementations of an electrical drive circuit and optical load described herein.

The following detailed description of example implementations refers to the accompanying drawings. The same reference numbers in different drawings may identify the same or similar elements.

TOF-based measurement systems may include an optical load (e.g., a laser diode, a semiconductor laser diode, a vertical-cavity surface-emitting laser (VCSEL), and/or the like) for emitting optical pulses into a field of view. As noted, TOF-based measurement systems determine distances to objects by measuring delays and/or differences between an emitted optical pulse and a reflected optical pulse. TOF-based measurement systems may perform direct time-of-flight (d-TOF) measurements and/or indirect time-of-flight (i-TOF) measurements. For d-TOF applications, a narrow optical pulse may be emitted into a field of view. For i-TOF applications, a rectangular-shaped pulse train may be emitted into a field of view. Emitting pulses having a well-defined origin in time and a rectangular shape may improve measurement precision and accuracy (e.g., as compared to pulses having a non-rectangular shape, a long rise time, and/or the like). To achieve such a rectangular shape, emitted optical pulses should have short rise times (e.g., a time during which power of the optical pulse is rising) and short fall times (e.g., a time during which power of the optical pulse is falling). For example, the rise time of an optical pulse may be a time during which power of the optical pulse rises from 10% of peak power to 90% of peak power, and may be referred to as a 10%-90% rise time. Similarly, the fall time of an optical pulse may be a time during which power of the optical pulse falls from 90% of peak power to 10% of peak power, and may be referred to as a 90%-10% fall time.

A circuit for driving an optical load is a set of electronic components interconnected by current-carrying conductors (e.g., traces). Any of the electronic components and conductors may have parasitic elements (e.g., a parasitic inductance, a parasitic resistance, and/or a parasitic capacitance). These parasitic elements may be undesirable, and, therefore, sought to be minimized. However, completely eliminating these parasitic elements may not be possible (e.g., due to manufacturability limitations, component size limitations, and/or the like). When a supply voltage is provided to the circuit to drive the optical load, the parasitic inductance, the parasitic resistance, and/or the parasitic capacitance in the circuit cause a delay between when the supply voltage is provided and when a current reaches a peak. The delay increases the rise time of the electrical pulse, which increases the rise time of the optical pulse (e.g., particularly when the circuit drives the optical load with a high current).

Some implementations described herein provide a method and/or an electrical drive circuit for driving an optical load to emit a rectangularly-shaped optical pulse. For example, the method and/or the electrical drive circuit may drive the optical load to emit an optical pulse having a short rise time (e.g., less than 100 picoseconds (ps)), a short fall time (e.g., less than 500 ps, less than 300 ps, and/or the like), and/or a constant amplitude. In some implementations, the method and/or the electrical drive circuit may charge one or more inductive elements of the electrical drive circuit; generate, for a first time interval, a main electrical pulse; discharge, during at least a portion of the first time interval, the one or more inductive elements to provide a compensation electrical pulse (e.g., a spike pulse); combine the main electrical pulse and the compensation electrical pulse into a combined electrical pulse; and provide the combined electrical pulse to the optical load. For example, the main electrical pulse may have a longer rise time (e.g., a slower rise time) as compared to the compensation electrical pulse, and the compensation electrical pulse may compensate for the longer rise time of the main electrical pulse. In this way, the method and/or the electrical drive circuit may drive, with the combined electrical pulse, the optical load to emit a rectangularly-shaped optical pulse. By driving the optical load to emit a rectangularly-shaped optical pulse, the method and/or the electrical drive circuit may improve performance of a time-of-flight-based measurement system.

FIG. 1 is a circuit diagram of an example implementation 100 of an electrical drive circuit and optical load 110 described herein. As shown in FIG. 1, an optical device may include a main circuit path 102, a charging circuit path 104, and a discharging circuit path 106. In some implementations and as described further herein, the main circuit path 102 may be used to generate a main electrical pulse, and the charging circuit path 104 and the discharging circuit path 106 may be used to generate a compensation electrical pulse.

As shown in FIG. 1, the optical device may further include a main source 108 (e.g., a first source), the optical load 110, a main switch 112 (e.g., a first switch), a main capacitive element 114, a rectifier diode 116, inductive elements 118 and 120, a compensation source 122 (e.g., a second source), a compensation capacitive element 124, a compensation inductive element 126, a compensation switch 128 (e.g., a second switch), a decoupling capacitive element 130, a first ground 132, and a second ground 134. In some implementations, the electrical drive circuit may include the main circuit path 102, the charging circuit path 104, the discharging circuit path 106, the main switch 112, the main capacitive element 114, the rectifier diode 116, the inductive elements 118 and 120, the compensation capacitive element 124, the compensation inductive element 126, the compensation switch 128, the decoupling capacitive element 130, the first ground 132, and the second ground 134.

In some implementations, the main electrical pulse and/or the compensation electrical pulse may also be referred to as a first electrical pulse, a second electrical pulse, and/or the like. Additionally, or alternatively, the main circuit path 102, the charging circuit path 104, and/or the discharging circuit path 106 may also be referred to as a first circuit path, a second circuit path, a third circuit path, and/or the like. Additionally, or alternatively, the main capacitive element 114, the compensation capacitive element 124, and/or the decoupling capacitive element 130 may also be referred to as a first capacitive element, a second capacitive element, a third capacitive element, and/or the like. In this regard, the adjectives "main," "charging," "discharging," "compensation," and "decoupling," are used herein for descriptive purposes and not to limit the scope of the elements, components, and/or the like which they modify, unless explicitly stated otherwise.

As shown in FIG. 1, the main circuit path 102 may be connected to the main source 108 and the optical load 110, and may include the main switch 112, the main capacitive element 114, the rectifier diode 116, and the inductive elements 118 and 120. The charging circuit path 104 may be connected to the compensation source 122, and may include the compensation capacitive element 124, the compensation inductive element 126, and the compensation switch 128.

The discharging circuit path 106 may be connected to the compensation source 122 and the optical load 110, and may include the compensation capacitive element 124, the compensation inductive element 126, the decoupling capacitive element 130, the main switch 112, and the inductive elements 118 and 120.

In some implementations, the main source 108 and/or the compensation source 122 may provide current to the electrical drive circuit. For example, the main source 108 and/or the compensation source 122 may be a DC (direct current) voltage source, a DC current source with a resistive load, and/or the like.

In some implementations, the optical load 110 may include an array of one or more light-emitting diodes, an array of one or more laser diodes, an array of one or more semiconductor laser diodes, an array of one or more vertical-cavity surface-emitting lasers (VCSELs), and/or the like. In some implementations, the optical load 110 may comprise multiple optical loads electrically connected in parallel and/or in series. For example, the optical load 110 may include a VCSEL array with 400 emitters electrically connected in parallel. As another example, the optical load 110 may include multiple VCSELs (e.g., arrays or singlets) connected in series (e.g., on a printed circuit board (PCB)), which may provide increased optical power as compared to a single VCSEL array.

In some implementations, when a forward bias is applied to the optical load 110, the optical load 110 may allow current flow primarily in only one direction (e.g., in a "forward" direction), and, when a reverse bias is applied to the optical load 110, the optical load 110 may not permit current flow, such as in a light-emitting diode, a laser diode, a VCSEL, and/or the like. Additionally, or alternatively, the optical load 110 may allow current flow in two directions (e.g., a forward direction and a reverse direction), such as in an incandescent light source and/or the like.

In some implementations, the main switch 112 and/or the compensation switch 128 may be a high speed and low output capacitance switch and may be a transistor, such as a field effect transistor (FET), a metal-oxide semiconductor field-effect transistor (MOSFET), a Gallium Nitride field-effect transistor (GaNFET), avalanche transistor, and/or the like. In some implementations, the compensation switch 128 may have a low inductance (e.g., to facilitate achieving a short rise time of the compensation electrical pulse).

In some implementations, the main capacitive element 114 may be a voltage storage element and may provide a surge current (e.g., during a duration of the main electrical pulse). Additionally, or alternatively, the main capacitive element 114 may include one or more capacitors.

In some implementations, the rectifier diode 116 may prevent current from the discharging circuit path 106 and/or the compensation source 122 from being shunted by the main source 108 (e.g., instead of flowing to the optical load 110). In this way, the rectifier diode 116 may ensure that current from the discharging circuit path 106 and/or the compensation source 122 is directed to the optical load 110. Additionally, or alternatively, the rectifier diode 116 may prevent current from the discharging circuit path 106 and/or the compensation source 122 from being influenced by the main source 108 and/or the main capacitive element 114. For example, the rectifier diode 116 may isolate current from the discharging circuit path 106 and/or the compensation source 122 from the main circuit path 102 (e.g., the main source 108 and/or the main capacitive element 114). Additionally, or alternatively, the electrical drive circuit may include more than one rectifier diodes (e.g., in parallel, in serial, and/or the like), another switch, sub-circuit, and/or the like instead of or in addition to the rectifier diode 116 to prevent current from the discharging circuit path 106 and/or the compensation source 122 from being shunted by the main source 108.

In some implementations, the inductive elements 118 and 120 may model parasitic inductances of current-carrying conductors in the electrical drive circuit. Additionally, or alternatively, the inductive elements 118 and 120 may model parasitic inductances of bond wires in the electrical drive circuit.

In some implementations, the compensation source 122 (e.g., a voltage source) may affect pulse height and width (e.g., amplitude and duration) of the compensation electrical pulse from the electrical drive circuit. For example, with increased voltage in the compensation source 122, the compensation electrical pulse may become larger and wider (e.g., increased amplitude and increased time duration). In some implementations, compensation current is supplied from the compensation capacitive element 124 (e.g., to the optical load 110), and, as the voltage of the compensation source 122 increases, fall time of the compensation electrical pulse may increase.

In some implementations, the compensation capacitive element 124 may include one or more capacitors (e.g., of compensation circuitry). In some implementations, the compensation capacitive element 124 may be referred to as a decoupling capacitor that may provide a surge current (e.g., during a duration of the compensation electrical pulse). Additionally, or alternatively, the compensation capacitive element 124 may have a low equivalent serial inductance (ESL).

In some implementations, the compensation inductive element 126 may include one or more inductive elements, and/or may model a total inductance of the charging circuit path 104 and/or the discharging circuit path 106. For example, the compensation inductive element 126 may model inductances of current-carrying conductors in the electrical drive circuit, bond wires in the electrical drive circuit, and/or the like.

In some implementations, the compensation inductive element 126 may include a trace (e.g., a circuit trace on a printed circuit board (PCB), a wire trace, a track, and/or the like) having a length and width based on required total inductance taking into account parasitic inductance of other circuit elements (e.g., current-carrying conductors in the electrical drive circuit, bond wires in the electrical drive circuit, and/or the like). In some implementations, the trace may have a length and width to achieve a total inductance for the electrical drive circuit. For example, the trace may be designed (e.g., have a length and width and/or the like) to add inductance to the electrical drive circuit, thereby increasing the total inductance for the electrical drive circuit.

Additionally, or alternatively, and as described further herein, an inductance of the compensation inductive element 126 and/or the total inductance of the electrical drive circuit may be selected, controlled, adjusted, and/or the like such that a fall time of the compensation electrical pulse corresponds to a rise time of the main electrical pulse, which may facilitate driving the optical load 110 to emit a rectangular-shaped optical pulse (e.g., a square-shaped optical pulse). For example, the compensation inductive element 126 may include a trace having a length and width to achieve, for the electrical drive circuit, a total inductance such that the compensation electrical pulse has a width and/or an amplitude that compensates the main electrical pulse.

In some implementations, the decoupling capacitive element 130 may include one or more capacitive elements. As shown in FIG. 1, the decoupling capacitive element 130 (e.g., a direct-current-blocking (DC-blocking) capacitor) may be positioned between point A and point B in the electrical drive circuit. In some implementations, the decoupling capacitive element 130 may isolate the main circuit path 102 from the charging circuit path 104, which may improve power efficiency of the electrical drive circuit. Additionally, or alternatively, the decoupling capacitive element 130 may allow the electrical drive circuit to generate and provide, to the optical load 110, a compensation electrical pulse that is a spike pulse (e.g., an electrical pulse having a short rise time, a short fall time, and/or the like).

In some implementations, the decoupling capacitive element 130 may be an alternating-current-coupling (AC-coupling) capacitor (e.g., having a capacitance of 1 nanofarad (nF)). In some implementations, the decoupling capacitive element 130 may have a capacitance of less than 100 picofarads (pF).

As noted above, the main circuit path 102 may be used to generate a main electrical pulse. The main switch 112 may have an open state (e.g., an off state), where, when the main switch 112 is in the open state, current may not flow through the main switch 112. In some implementations, when the main switch 112 is in the open state, current may not flow through the optical load 110. The main switch 112 may also have a closed state (e.g., an on state), where, when the main switch 112 is in the closed state, current may flow through the main switch 112. In some implementations, when the main switch 112 is in the closed state, current may flow through the main circuit path 102 and generate the main electrical pulse. The electrical drive circuit may provide the main electrical pulse to the optical load 110. In some implementations, and as described further herein, the optical load 110 may emit, based on the main electrical pulse, an optical pulse with a slow rise time (e.g., a long rise time) similar to an optical pulse shown and described herein with respect to FIG. 6.

As shown in FIG. 1, the main capacitive element 114 (e.g., a voltage storage capacitive element) may be connected in parallel to the main source 108. In some implementations, because the main capacitive element 114 is connected closer to the optical load 110 than the main source 108, when the main switch 112 transitions from the open state to the closed state, current may flow through the main capacitive element 114 of the main circuit path 102 more immediately than through the main source 108.

In some implementations, an input (e.g., a voltage, a current, and/or the like) provided by the main source 108 may be controlled to adjust characteristics of the main electrical pulse. For example, a higher voltage provided by the main source 108 may increase a maximum amplitude of the main electrical pulse as compared to another maximum amplitude of the main electrical pulse when a lower voltage is provided by the main source 108. As another example, a higher voltage provided by the main source 108 may reduce a rise time of the main electrical pulse as compared to another rise time of the main electrical pulse when a lower voltage is provided by the main source 108.

As also noted above, the charging circuit path 104 and the discharging circuit path 106 may be used to generate a compensation electrical pulse. The compensation switch 128 may have an open state (e.g., an off state), where, when the compensation switch 128 is in the open state, current may not flow through the compensation switch 128. Additionally, the compensation switch 128 may have a closed state (e.g., an on state), where, when the compensation switch 128 is in the closed state, current may flow through the compensation switch 128. In some implementations, when the compensation switch 128 is in the closed state, current charges the compensation inductive element 126 (e.g., including one or more parasitic elements in the driver circuit) through the charging circuit path 104. For example, when the compensation switch 128 is in the closed state, current may flow through the compensation switch 128 and charge (e.g., during a charging time) the compensation inductive element 126 (e.g., including one or more parasitic elements in the driver circuit) through the charging circuit path 104.

In some implementations, when the compensation switch 128 transitions from the closed state to the open state, current may not flow through the compensation switch 128, and current may discharge from the compensation inductive element 126 (e.g., including one or more parasitic elements in the driver circuit) through the discharging circuit path 106 and generate a compensation electrical pulse. For example, when the compensation switch 128 transitions from the closed state to the open state, current may not flow through the compensation switch 128, and current may discharge, during a discharge time, from the compensation inductive element 126 (e.g., including one or more parasitic elements in the driver circuit) through the discharging circuit path 106.

As shown in FIG. 1, the compensation capacitive element 124 (e.g., a voltage storage capacitive element) may be connected in parallel to the compensation source 122, and the compensation capacitive element 124 may be closer (e.g., in a practical sense) to the compensation inductive element 126 and the optical load 110 than the compensation source 122. In some implementations, the compensation capacitive element 124 may provide a faster current change than the compensation source 122. For example, the compensation source 122 may have a large inductance in a path between the compensation source 122 and the compensation inductive element 126, which may prevent the compensation source 122 from providing a fast current change. In some implementations, a majority (e.g., almost 100%) of the current discharged through discharging circuit path 106 may be provided by the compensation capacitive element 124 (e.g., which may be slowly charged by the compensation source 122 before the compensation switch 128 transitions from the closed state to the open state).

In some implementations, an input (e.g., a voltage, a current, and/or the like) provided by the compensation source 122 may be controlled to adjust characteristics of the compensation electrical pulse. For example, a higher voltage provided by the compensation source 122 may increase a maximum amplitude of the compensation electrical pulse as compared to another maximum amplitude of the compensation electrical pulse when a lower voltage is provided by the compensation source 122. As another example, a higher voltage provided by the compensation source 122 may reduce a charging time of the compensation inductive element 126 as compared to another charging time of the compensation inductive element 126 when a lower voltage is provided by the compensation source 122. In some implementations, and as noted above, a capacitance of the compensation capacitive element 124 may affect pulse height and width (e.g., amplitude and duration) of the compensation electrical pulse.

Additionally, or alternatively, an inductance of the compensation inductive element 126 may be controlled to adjust characteristics of the compensation electrical pulse. For example, a higher inductance of the compensation inductive element 126 may increase a fall time of the compensation electrical pulse as compared to another fall time of the compensation electrical pulse when the compensation inductive element 126 has a lower inductance. In some implementations, and as further described herein with respect to FIG. 9, the inductance of the compensation inductive element 126 may be selected, controlled, adjusted, and/or the like such that a fall time of the compensation electrical pulse corresponds to a rise time of the main electrical pulse, which may facilitate driving the optical load 110 to emit a rectangular-shaped optical pulse.

The electrical drive circuit may provide the compensation electrical pulse to the optical load 110. For example, the rectifier diode 116 may prevent current from the discharging circuit path 106 from being shunted by the main source 108 (e.g., instead of flowing to the optical load 110). In some implementations, and as described further herein, the optical load 110 may emit, based on the compensation electrical pulse, an optical pulse with a short rise time (e.g., a fast rise time) similar to an optical pulse shown and described herein with respect to FIG. 7.

In some implementations, and as described further herein with respect to FIGS. 5A, 5B, 8, 9, 10, and 11, a timing of the main switch 112 and the compensation switch 128 may be controlled (e.g., by a controller) such that the electrical drive circuit generates the main electrical pulse and the compensation electrical pulse, combines the main electrical pulse and the compensation electrical pulse into a combined electrical pulse, and provides the combined electrical pulse to the optical load. For example, the timing of the main switch 112 and the compensation switch 128 may be controlled such that the compensation electrical pulse is discharged during a discharge time that at least partially overlaps with a time interval during which the main electrical pulse is generated. Additionally, or alternatively, the timing of the main switch 112 and the compensation switch 128 may be controlled such that a fall time of the compensation electrical pulse corresponds to a rise time of the main electrical pulse. Furthermore, the timing of the main switch 112 and the compensation switch 128 may be controlled such that the combined electrical pulse has a rise time proportional to a rise time of the compensation electrical pulse.

As indicated above, FIG. 1 is provided merely as an example. Other examples may differ from what is described with regard to FIG. 1.

Figure 2:
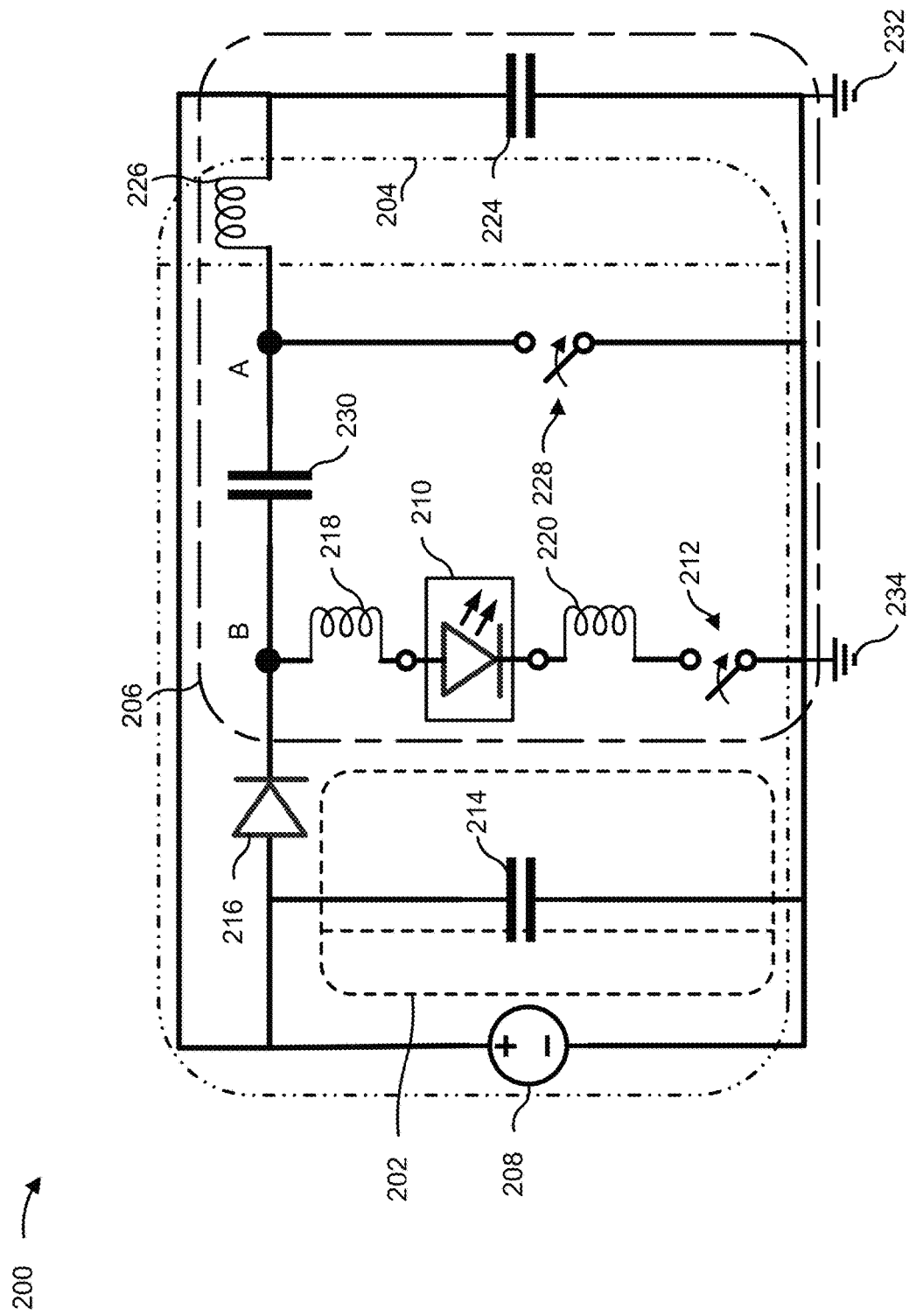

FIG. 2 is a circuit diagram of an example implementation 200 of an electrical drive circuit and optical load 210 described herein. Example implementation 200 may be similar to example implementation 100 described herein with respect to FIG. 1, but example implementation 200 may not include the compensation source 122 of example implementation 100. For example, and as shown in FIG. 2, an optical device may include a main circuit path 202, a charging circuit path 204, and a discharging circuit path 206 that are connected to the main source 208 (e.g., a single source).

In some implementations, the main circuit path 202, the charging circuit path 204, and the discharging circuit path 206 may be similar to the main circuit path 102, the charging circuit path 104, and the discharging circuit path 106, respectively, as described herein with respect to example implementation 100 and FIG. 1. For example, the main circuit path 202 may be used to generate a main electrical pulse, and the charging circuit path 204 and the discharging circuit path 206 may be used to generate a compensation electrical pulse.

As shown in FIG. 2, the optical device may further include a main source 208 (e.g., a first source), the optical load 210, a main switch 212 (e.g., a first switch), a main capacitive element 214 (e.g., a first capacitive element), a rectifier diode 216, inductive elements 218 and 220, a compensation capacitive element 224 (e.g., a second capacitive element), a compensation inductive element 226, a compensation switch 228 (e.g., a second switch), a decoupling capacitive element 230 (e.g., a third capacitive element), a first ground 232, and a second ground 234. In some implementations, the electrical drive circuit may include the main circuit path 202, the charging circuit path 204, the discharging circuit path 206, the main switch 212, the main capacitive element 214, the rectifier diode 216, the inductive elements 218 and 220, the compensation capacitive element 224, the compensation inductive element 226, the compensation switch 228, the decoupling capacitive element 230, the first ground 232, and the second ground 234.

In some implementations, the main source 208, the optical load 210, the main switch 212, the main capacitive element 214, the rectifier diode 216, the inductive elements 218 and 220, the compensation capacitive element 224, the compensation inductive element 226, the compensation switch 228, and the decoupling capacitive element 230 may be similar to the main source 108, the optical load 110, the main switch 112, the main capacitive element 114, the rectifier diode 116, the inductive elements 118 and 120, the compensation capacitive element 124, the compensation inductive element 126, the compensation switch 128, and the decoupling capacitive element 130, respectively, as described herein with respect to example implementation 100 and FIG. 1.

In some implementations, an input (e.g., a voltage, a current, and/or the like) provided by the main source 208 may be controlled to adjust characteristics of the compensation electrical pulse in a manner similar to that described herein with respect to controlling an input provided by the compensation source 122 as described with respect to example implementation 100 and FIG. 1. In other words, rather than controlling input provided by a compensation source to adjust characteristics of the compensation electrical pulse, in the example implementation 200 of FIG. 2 the input of the main source 208 may be controlled to adjust characteristics of the compensation electrical pulse. Additionally, or alternatively, the electrical drive circuit of example implementation 200 and/or a timing of the main switch 212 and the compensation switch 228 may be controlled (e.g., by a controller) in a manner similar to that described herein with respect to example implementation 100 and FIG. 1.

As indicated above, FIG. 2 is provided merely as an example. Other examples may differ from what is described with regard to FIG. 2.

Figure 3:
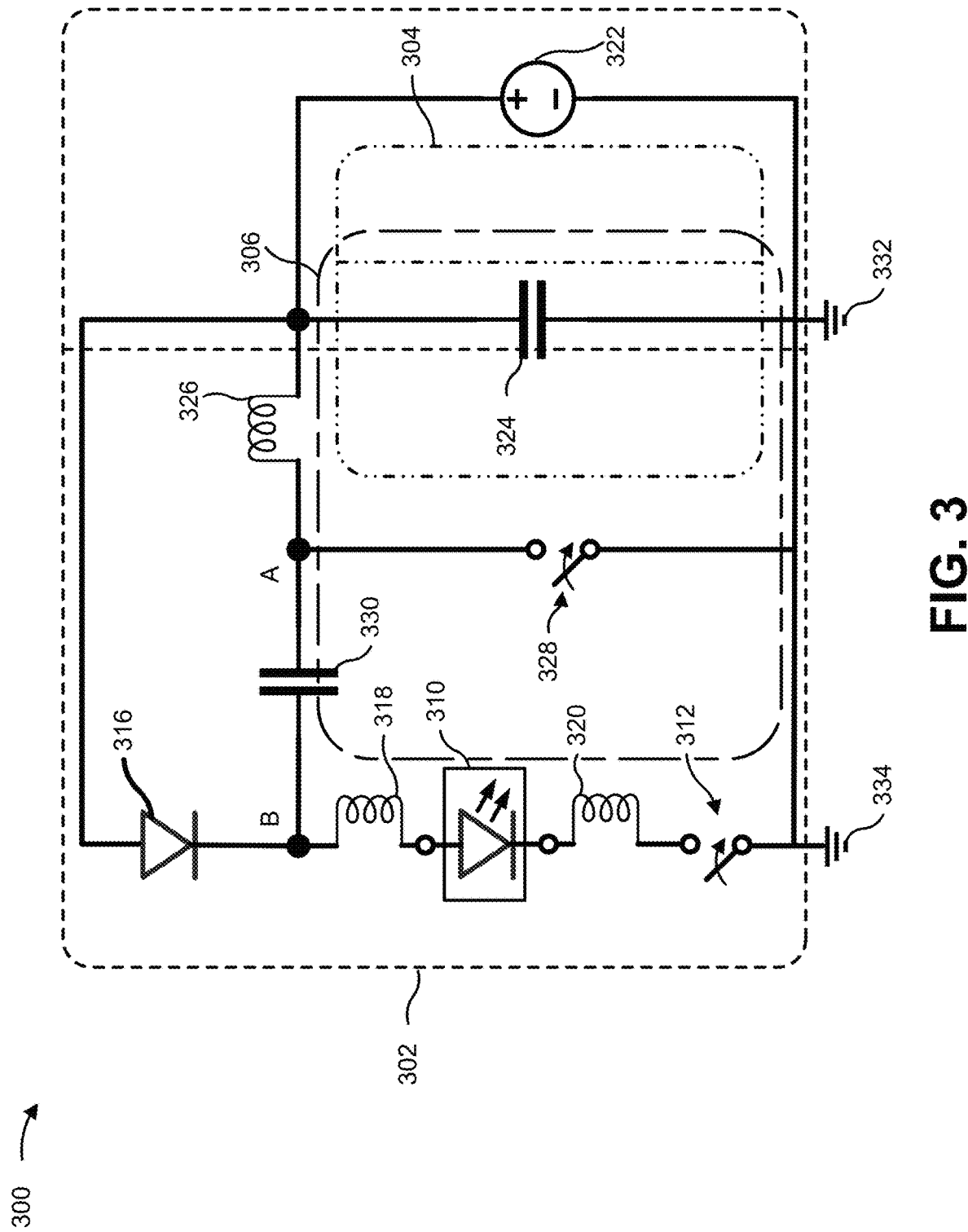

FIG. 3 is a circuit diagram of an example implementation 300 of an electrical drive circuit and optical load 310 described herein. Example implementation 300 may be similar to example implementation 100 described herein with respect to FIG. 1, but example implementation 300 may not include the main source 108 or the main capacitive element 114 of example implementation 100. For example, and as shown in FIG. 3, an optical device may include a main circuit path 302, a charging circuit path 304, and a discharging circuit path 306 that are connected to a compensation source 322 (e.g., a single source) and include (e.g., share) a compensation capacitive element 324.

In some implementations, the main circuit path 302, the charging circuit path 304, and the discharging circuit path 306 may be similar to the main circuit path 102, the charging circuit path 104, and the discharging circuit path 106, respectively, as described herein with respect to example implementation 100 and FIG. 1. For example, the main circuit path 302 may be used to generate a main electrical pulse, and the charging circuit path 304 and the discharging circuit path 306 may be used to generate a compensation electrical pulse.

As shown in FIG. 3, the optical device may further include the optical load 310, a main switch 312 (e.g., a first switch), a rectifier diode 316, inductive elements 318 and 320, a compensation source 322, a compensation capacitive element 324, a compensation inductive element 326, a compensation switch 328 (e.g., a second switch), a decoupling capacitive element 330, a first ground 332, and a second ground 334. In some implementations, the electrical drive circuit may include the main circuit path 302, the charging circuit path 304, the discharging circuit path 306, the main switch 312, the rectifier diode 316, the inductive elements 318 and 320, the compensation capacitive element 324, the compensation inductive element 326, the compensation switch 328, the decoupling capacitive element 330, the first ground 332, and the second ground 334.

In some implementations, the optical load 310, the main switch 312, the rectifier diode 316, the inductive elements 318 and 320, the compensation source 322, the compensation capacitive element 324, the compensation inductive element 326, the compensation switch 328, and the decoupling capacitive element 330 may be similar to the optical load 110, the main switch 112, the rectifier diode 116, the inductive elements 118 and 120, the compensation source 122, the compensation capacitive element 124, the compensation inductive element 126, the compensation switch 128, and the decoupling capacitive element 130, respectively, as described herein with respect to example implementation 100 and FIG. 1.

In some implementations, an input (e.g., a voltage, a current, and/or the like) provided by the compensation source 322 may be controlled to adjust characteristics of the main electrical pulse in a manner similar to that described herein with respect to controlling an input provided by the main source 108 as described with respect to example implementation 100 and FIG. 1. In other words, rather than controlling input provided by a main source to adjust characteristics of the main electrical pulse, in the example implementation 300 of FIG. 3 the input of the compensation source 322 may be controlled to adjust characteristics of the main electrical pulse.

In some implementations, the compensation capacitive element 324 may affect pulse height and width (e.g., amplitude and duration) of the main electrical pulse in a manner similar to that described herein with respect to the main capacitive element 114 affecting pulse height and width of the main electrical pulse. In other words, rather than a capacitance of a main capacitive element affecting pulse height and width of the main electrical pulse, in the example implementation 300 of FIG. 3, a capacitance of the compensation capacitive element 324 may affect pulse height and width of the main electrical pulse.

Additionally, or alternatively, the electrical drive circuit of example implementation 300 and/or a timing of the main switch 312 and the compensation switch 328 may be controlled (e.g., by a controller) in a manner similar to that described herein with respect to example implementation 100 and FIG. 1.

As indicated above, FIG. 3 is provided merely as an example. Other examples may differ from what is described with regard to FIG. 3.

Figure 4:
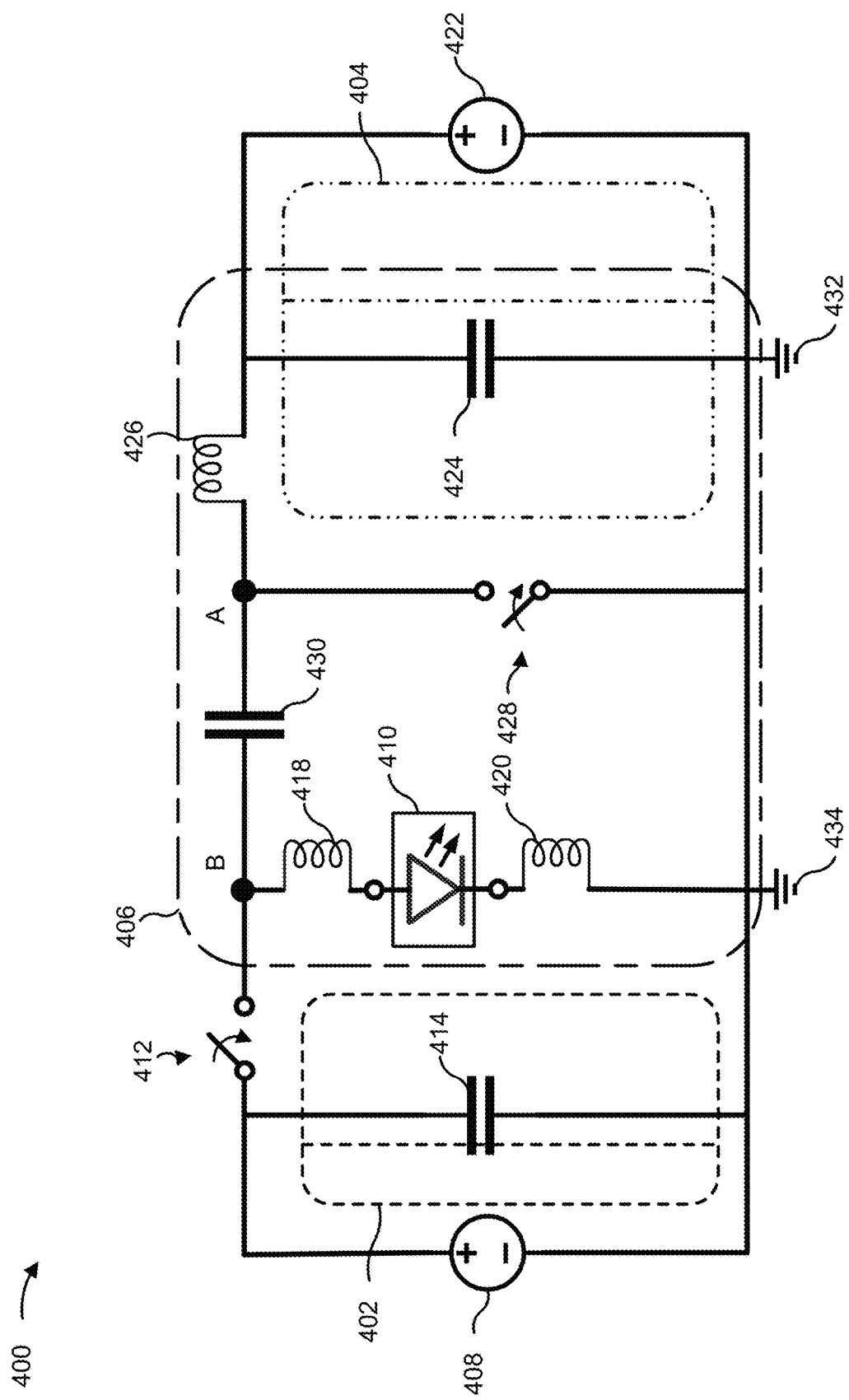

FIG. 4 is a circuit diagram of an example implementation 400 of an electrical drive circuit and optical load 410 described herein. Example implementation 400 may be similar to example implementation 100 described herein with respect to FIG. 1, but example implementation 400 may not include the rectifier diode 116 of example implementation 100, and a main switch 412 may be positioned between a main source 408 and the optical load 410 and between the main source 408 and a decoupling capacitive element 430. For example, the main switch 412, rather than being positioned in a same location as the main switch 112, may be positioned in a same location as and/or may replace the rectifier diode 116.

In some implementations, and as shown in FIG. 4, an optical device may include a main circuit path 402, a charging circuit path 404, and a discharging circuit path 406. The main circuit path 402, the charging circuit path 404, and the discharging circuit path 406 may be similar to the main circuit path 102, the charging circuit path 104, and the discharging circuit path 106, respectively, as described herein with respect to example implementation 100 and FIG. 1. For example, the main circuit path 402 may be used to generate a main electrical pulse, and the charging circuit path 404 and the discharging circuit path 406 may be used to generate a compensation electrical pulse.

As shown in FIG. 4, the optical device may further include a main source 408 (e.g., a first source), the optical load 410, the main switch 412, a main capacitive element 414 (e.g., a first capacitive element), inductive elements 418 and 420, a compensation source 422, a compensation capacitive element 424 (e.g., a second capacitive element), a compensation inductive element 426, a compensation switch 428 (e.g., a second switch), a decoupling capacitive element 430 (e.g., a third capacitive element), a first ground 432, and a second ground 434. In some implementations, the electrical drive circuit may include the main circuit path 402, the charging circuit path 404, the discharging circuit path 406, the main switch 412, the main capacitive element 414, the inductive elements 418 and 420, the compensation capacitive element 424, the compensation inductive element 426, the compensation switch 428, the decoupling capacitive element 430, the first ground 432, and the second ground 434.

In some implementations, the main source 408, the optical load 410, the main switch 412, the main capacitive element 414, the inductive elements 418 and 420, the compensation source 422, the compensation capacitive element 424, the compensation inductive element 426, the compensation switch 428, and the decoupling capacitive element 430 may be similar to the main source 108, the optical load 110, the main switch 112, the main capacitive element 114, the inductive elements 118 and 120, the compensation source 122, the compensation capacitive element 124, the compensation inductive element 126, the compensation switch 128, and the decoupling capacitive element 130, respectively, as described herein with respect to example implementation 100 and FIG. 1.

In some implementations, the main switch 412 may be controlled to prevent current from the charging circuit path 404, the discharging circuit path 406, and/or the compensation source 422 from being shunted by the main source 408 (e.g., instead of flowing to the optical load 410). In this way, the main switch 412 may ensure that current from the charging circuit path 404, the discharging circuit path 406, and/or the compensation source 422 is directed to the optical load 410.

Additionally, or alternatively, the electrical drive circuit of example implementation 400 and/or a timing of the main switch 412 and the compensation switch 428 may be controlled (e.g., by a controller) in a manner similar to that described herein with respect to example implementation 100 and FIG. 1.

As indicated above, FIG. 4 is provided merely as an example. Other examples may differ from what is described with regard to FIG. 4.

FIG. 5A is a diagram of an example implementation 500 of a controller 502 for an electrical drive circuit described herein. As shown in FIG. 5A, the example implementation 500 may include the controller 502, a main gate driver 504, a compensation gate driver 506, a main switch 508, and a compensation switch 510. In some implementations, an integrated circuit may include the controller 502, the main gate driver 504, the compensation gate driver 506, the main switch 508, the compensation switch 510, and/or the like.

Additionally, or alternatively, the main switch 508 and the compensation switch 510 may be similar to the main switch 112 and the compensation switch 128, respectively, as described herein with respect to example implementation 100 and FIG. 1. Furthermore, the main switch 508 and the compensation switch 510 may, respectively, correspond to main switches (e.g., the main switch 112 of FIG. 1, the main switch 212 of FIG. 2, the main switch 312 of FIG. 3, the main switch 412 of FIG. 4, and/or the like) and compensation switches (e.g., the compensation switch 128 of FIG. 1, the compensation switch 228 of FIG. 2, the compensation switch 328 of FIG. 3, the compensation switch of FIG. 4, and/or the like) in the example implementations 100, 200, 300, and 400. In other words, example implementation 500 and controller 502 may be used to control main switches and compensation switches for the electrical drive circuits described herein with respect to FIGS. 1-4.

FIG. 5B is a diagram of an example implementation 550 of a process implemented by the controller 502 for the electrical drive circuit described herein. As shown in FIG. 5B, the controller 502 may receive a laser pulse input (logic level) (e.g., a logic input signal), which may signal that an optical load (e.g., the optical load 110 of FIG. 1, the optical load 210 of FIG. 2, the optical load 310 of FIG. 3, the optical load 410 of FIG. 4, and/or the like) driven by the electrical drive circuit should turn on. The controller 502 may, based on the laser pulse input, generate control signals (e.g., voltages) for the main gate driver 504 and/or the compensation gate driver 506 to turn the main switch 508 and/or the compensation switch 510 on or off (e.g., to open or close the main switch 508 and/or the compensation switch 510) according to switch timings described herein (e.g., with respect to FIGS. 8-9 and 11 and/or the like).

As shown in FIG. 5B, the process of example implementation 550 may include the controller 502 performing delay tuning for the control signal provided to the main gate driver 504 of the main switch 508. As described herein with respect to FIG. 1, the timing of the main switch 112 and the compensation switch 128 may be controlled such that the compensation electrical pulse is discharged during a discharge time that at least partially overlaps with a time interval during which the main electrical pulse is generated. When the controller 502 performs delay tuning, the controller 502 may adjust the control signal provided to the main gate driver 504 of the main switch 508 such that the compensation electrical pulse is discharged during a discharge time that at least partially overlaps with a time interval during which the main electrical pulse is generated. For example, and as further described with respect to FIG. 8, the controller 502 may perform delay tuning to adjust a time interval between when the compensation switch 510 transitions from a closed state to an open state (e.g., to generate the compensation electrical pulse) and when the main switch 508 transitions from an open state to a closed state (e.g., to generate the main electrical pulse).

As also shown in FIG. 5B, the process of example implementation 550 may include the controller 502 performing pulse width tuning for the control signal provided to the compensation gate driver 506 of the compensation switch 510. As described herein with respect to FIG. 1, when the compensation switch 128 is in the closed state, current may flow through the compensation switch 128 and charge, during a charging time, the compensation inductive element 126, and when the compensation switch 128 transitions from the closed state to the open state, current may discharge from the compensation inductive element 126 to generate the compensation electrical pulse. In some implementations, a longer charging time may generate a wider pulse width for the compensation electrical pulse than a pulse width achieved with a shorter charging time. Thus, a charging time (e.g., when the compensation switch 510 is in a closed state) may be adjusted to tune a pulse width of the compensation electrical pulse. In some implementations, when the controller 502 performs pulse width tuning, the controller 502 may adjust the control signal provided to the compensation gate driver 506 of the compensation switch 510 such that the compensation switch 510 is in the closed state for a charging time that achieves a pulse width for the compensation signal that corresponds to a rise time of the main electrical pulse.

Furthermore, tuning the pulse width of the compensation electrical pulse may adjust a fall time of the compensation electrical pulse. Accordingly, the charging time may be adjusted to tune the fall time of the compensation electrical pulse. Thus, in some implementations, the controller 502 may perform pulse width tuning such that a fall time of the compensation electrical pulse corresponds to a rise time of the main electrical pulse. For example, when the controller 502 performs pulse width tuning, the controller 502 may adjust the control signal provided to the compensation gate driver 506 of the compensation switch 510 such that the compensation switch 510 is in the closed state for a charging time that achieves a fall time of the compensation electrical pulse that corresponds to a rise time of the main electrical pulse.

As indicated above, FIGS. 5A and 5B are provided merely as examples. Other examples may differ from what is described with regard to FIGS. 5A and 5B.

Figure 6:
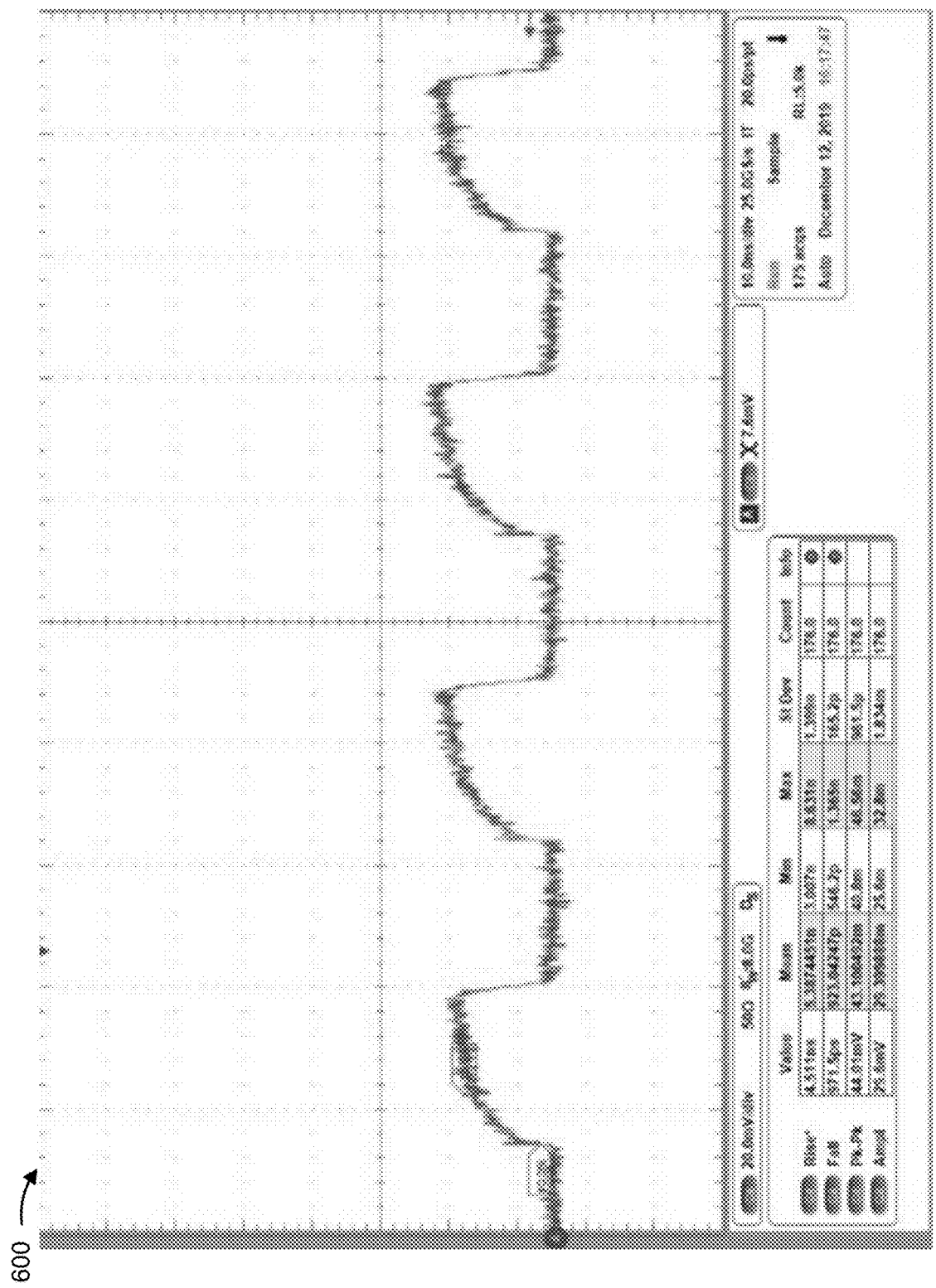
FIG. 6 is a diagram of an example graph plotting voltages from an optical detector receiving an optical signal associated with an example implementation of an electrical drive circuit and optical load described herein.

FIG. 6 is a diagram of an example graph 600 (e.g., that may be obtained from an oscilloscope) plotting voltages from an optical detector receiving an optical signal associated with an example implementation of an electrical drive circuit and optical load described herein. For example, the electrical drive circuit and optical load may be similar to the electrical drive circuits and the optical loads described herein with respect to FIGS. 1-4. The example graph 600 plots an optical signal generated by a DC-coupled VCSEL array in response to electrical signals provided, by the electrical drive circuit, to the DC-coupled VCSEL array, where the electrical signals correspond to a series of main electrical pulses similar to the main electrical pulses described herein with respect to FIGS. 1-4, 5A, and 5B.

As shown in FIG. 6, the optical pulses of the optical signal have a long rise time (e.g., due to parasitic inductance), which distorts a shape of the optical pulses away from a rectangular shape. Additionally, and as also shown in FIG. 6, the optical pulses have a short fall time (e.g., a fast fall time), where power of the optical pulse is falling from peak power to zero. As noted herein, short fall times may facilitate achievement of a rectangular-shaped optical pulse.

Figure 7:
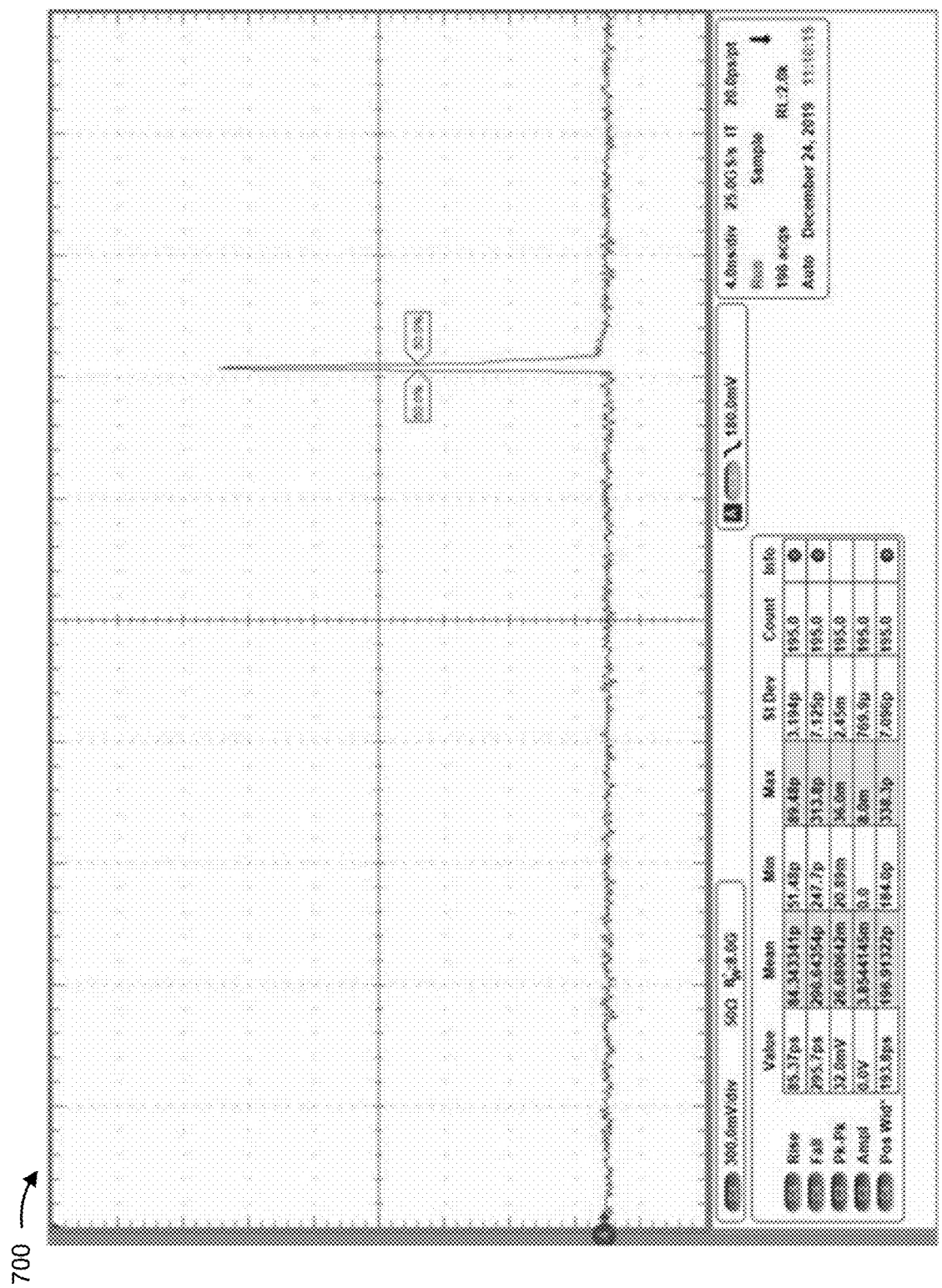
FIG. 7 is a diagram of an example graph plotting voltages from an optical detector receiving an optical signal associated with an example implementation of an electrical drive circuit and optical load described herein.

FIG. 7 is a diagram of an example graph 700 (e.g., that may be obtained from an oscilloscope) plotting voltages from an optical detector receiving an optical signal associated with an example implementation of an electrical drive circuit and optical load described herein. For example, the electrical drive circuit and optical load may be similar to the electrical drive circuits and the optical loads described herein with respect to FIGS. 1-4. The example graph 700 plots an optical signal generated by an AC-coupled VCSEL array in response to electrical signals provided, by the electrical drive circuit, to the AC-coupled VCSEL array, where the electrical signals correspond to a compensation electrical pulse similar to the compensation electrical pulses described herein with respect to FIGS. 1-4, 5A, and 5B.

As shown in FIG. 7, the optical pulse has a short rise time (e.g., a fast rise time). As noted herein, short rise times may facilitate achievement of a rectangular-shaped optical pulse. Additionally, and as also shown in FIG. 7, the optical pulse has a narrow width and a fall time, which, in some implementations, may be tuned to compensate for a rise time of a main electrical pulse as described herein.

In FIGS. 6-7, limitations on measurement equipment (e.g. bandwidth limitations on oscilloscopes, parasitic aspects of a probe, EMI (Electro Magnetic Interference) from high speed switching FET (Field Effect Transistor), and/or the like) may inhibit clean and accurate measurements of sub-nanosecond or picosecond electrical pulses directly from the electrical drive circuit. Accordingly, simulations may be used to estimate peak current provided by an electrical drive circuit to an optical load.

As indicated above, FIGS. 6-7 are provided merely as examples. Other examples may differ from what is described with regard to FIGS. 6-7.

Figure 8:
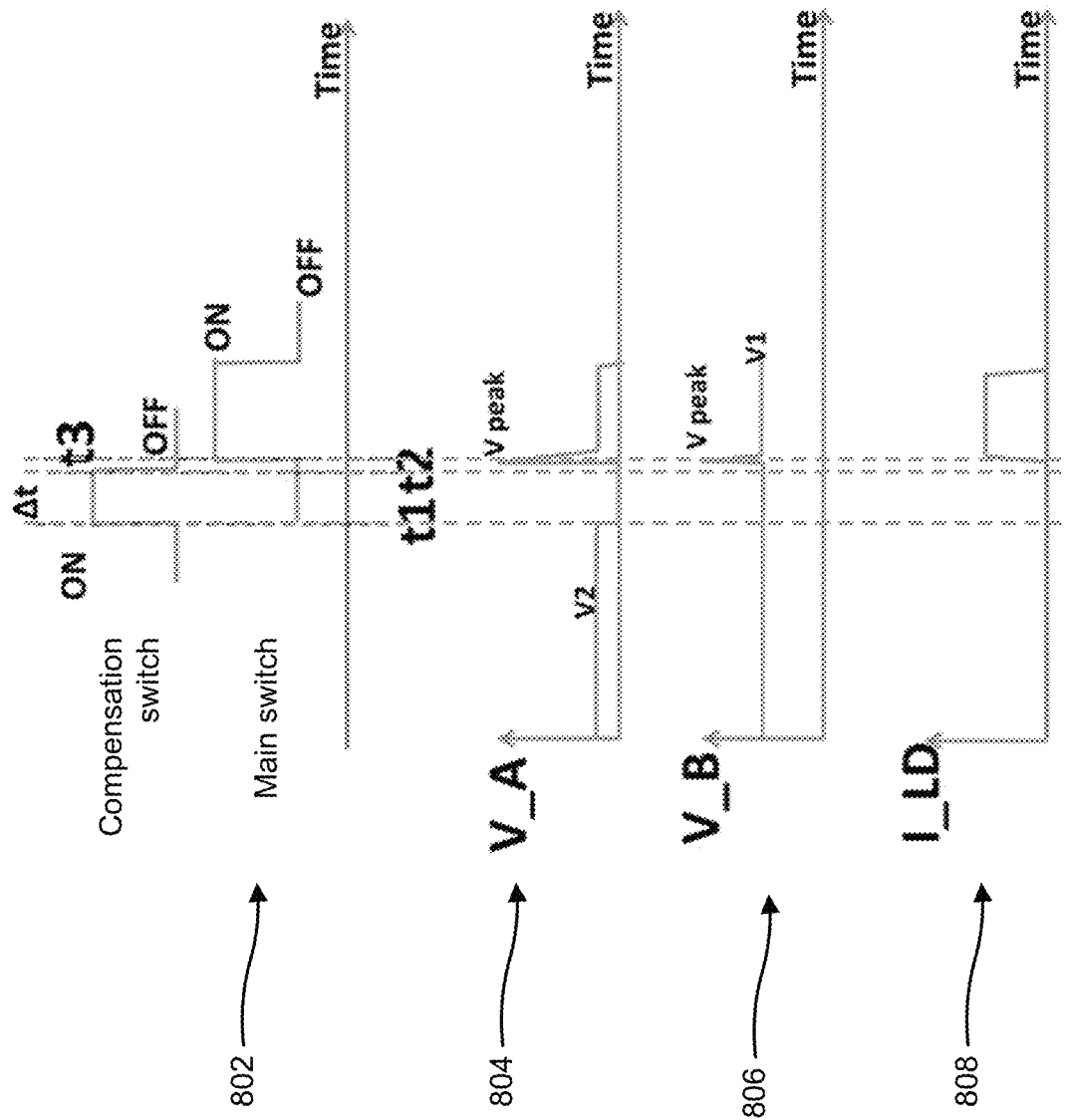
FIG. 8 is a diagram of example graphs plotting switch timing in an example implementation of an electrical drive circuit, voltage at a point in the example implementation of an electrical drive circuit, voltage at another point in the example implementation of an electrical drive circuit, and current provided by the example implementation of an electrical drive circuit to an optical load.

FIG. 8 is a diagram of example graphs 802, 804, 806, and 806 plotting switch timing in an example implementation of an electrical drive circuit (example graph 802), voltage at a point in the example implementation of an electrical drive circuit (example graph 804), voltage at another point in the example implementation of an electrical drive circuit (example graph 806), and current provided by the example implementation of an electrical drive circuit to an optical load (example graph 808). For example, the electrical drive circuit and optical load may be similar to the electrical drive circuits and the optical loads described herein with respect to FIGS. 1-4.

Example graph 802 may plot switch timing of a main switch (e.g., the main switch 112 of FIG. 1, the main switch 212 of FIG. 2, the main switch 312 of FIG. 3, the main switch 412 of FIG. 4, and/or the like) and a compensation switch (e.g., the compensation switch 128 of FIG. 1, the compensation switch 228 of FIG. 2, the compensation switch 328 of FIG. 3, the compensation switch of FIG. 4, and/or the like). As shown in FIG. 8, the main switch and the compensation switch may initially be off (e.g., in an open state), and, at a time t1, the compensation switch may turn on (e.g., transition from the open state to a closed state).

As further shown in FIG. 8 by example graph 802, the compensation switch may remain on (e.g., in the closed state) for a time interval $\Delta t$. In some implementations, the time interval $\Delta t$ may correspond to a charging time as described herein with respect to FIGS. 1-4, 5A, and 5B. For example, during the time interval $\Delta t$, an electrical drive circuit may cause current to charge one or more inductive elements (e.g., through a charging circuit path).

As shown in FIG. 8 by example graph 802, the compensation switch may turn off (e.g., transition from a closed state to an open state) at a time t2. In some implementations, when the compensation switch turns off, one or more inductive elements may discharge to provide a compensation electrical pulse as described herein with respect to FIGS. 1-4, 5A, and 5B.

As further shown in FIG. 8 by example graph 802, the main switch may turn on (e.g., transition from the open state to a closed state) at a time t3. In some implementations, when the main switch turns on, the electrical drive circuit may generate a main electrical pulse as described herein with respect to FIGS. 1-4, 5A, and 5B. Additionally, or alternatively, and as shown in FIG. 8 by example graph 802, the main switch may remain on (e.g., in the closed state) for a main time interval and then turn off. In some implementations, the time t2 and the time t3 may be a same time. In some implementations, the time t2 may occur after the time t3.

Example graph 804 plots voltage V_A at a point A in the example implementations of the electrical drive circuit. For example, the point A of FIG. 8 may correspond to point A as shown in FIGS. 1-4. As shown in FIG. 8 by example graph 804, the voltage V_A may correspond to a voltage V2 when the main switch and the compensation switch are off (e.g., in an open state). For example, the voltage V2 may correspond to a voltage of compensation source 122 of FIG. 1.

As further shown in FIG. 8 by example graph 804, at time t1 when the compensation switch turns on (e.g., transitions from the open state to a closed state), the voltage V_A goes to zero (e.g., because the compensation switch shorts point A to ground). In some implementations, at time a when the compensation switch turns on, current at point A may increase and pass through the compensation switch during the time interval $\Delta t$.

As shown in FIG. 8 by example graph 804, at time t2 when the compensation switch turns off (e.g., transitions from the closed state to the open state), the voltage V_A may not immediately increase. In some implementations, at time t2 when the compensation switch turns off, the voltage V_A may not immediately increase because there may be a short delay (e.g., two nanoseconds or less, one nanosecond or less, 0.5 nanoseconds or less, and/or the like) between time t2 and when the one or more inductive elements discharge current through point A (e.g., to provide a compensation electrical pulse). Additionally, or alternatively, the time t2 and the time t3 may be controlled, adjusted, and/or the like (e.g., by a controller performing delay tuning as noted with respect to FIGS. 5A and 5B) to account for the short delay such that, as shown in example graph 804, the voltage V_A may increase to a voltage peak V peak at the time t3 when the main switch turns on (e.g., transitions from the open state to a closed state). In some implementations, the time t2 and the time t3 may be controlled, adjusted, and/or the like (e.g., by a controller performing delay tuning as noted with respect to FIGS. 5A and 5B) based on a pulse width of the compensation electrical pulse, control signal propagation delays (e.g., from the controller to the gate drivers and/or the like), and/or the like. However, as noted above, the time t2 and the time t3 may be a same time in some implementations.

As further shown in FIG. 8 and by example graph 804, after reaching the voltage peak V peak at the time t3, the voltage V_A may decrease to the voltage V2. For example, the one or more inductive elements discharging current through point A may increase the voltage V_A to the voltage peak V peak and, as the current discharged by the one or more inductive elements decreases, the voltage V_A may decrease to the voltage V2 (e.g., corresponding to a voltage of compensation source 122 of FIG. 1).

Example graph 806 may plot voltage V_B at a point B in the example implementations of the electrical drive circuit. For example, the point B of FIG. 8 may correspond to point B as shown in FIGS. 1-4. As shown in FIG. 8 by example graph 806, the voltage V_B may correspond to a voltage V1 when the main switch and the compensation switch are off (e.g., in an open state). For example, the voltage V1 may correspond to a voltage of main source 108 of FIG. 1. As further shown in FIG. 8 by example graph 806, the voltage V_B may remain at the voltage V1 at time t1 when the compensation switch turns on, during the time interval Δt, and when the compensation switch turns off at time t2.

As shown in FIG. 8 by example graph 806, the voltage V_B may increase to the voltage peak V peak at time t3 when the main switch turns on. As noted with respect to example graph 804, when the compensation switch turns off, there may be a short delay (e.g., two nanoseconds or less, one nanosecond or less, 0.5 nanoseconds or less, and/or the like) between time t2 and when the one or more inductive elements discharge current (e.g., to provide a compensation electrical pulse) through point A and point B, and the time t2 and the time t3 may be controlled, adjusted, and/or the like to account for the short delay. Thus, when the current discharged by the one or more inductive elements passes through point B, the voltage V_B may increase to the voltage peak V peak, and, because the main switch turns on at a same time, the current discharged by the one or more inductive elements may pass through point B to the optical load. In some implementations, a voltage value of V peak in example graph 806 may be a different voltage value of V peak in example graph 804.

Example graph 808 plots current provided by the example implementation of the electrical drive circuit to the optical load. As shown in FIG. 8, the electrical drive circuit may not provide any current to the optical load until the main switch turns on (e.g., transitions from the open state to a closed state) at time t3. However, because the time t3 may be controlled, adjusted, and/or the like to account for the short delay between time t2 and when the one or more inductive elements discharge current to provide a compensation electrical pulse, when the main switch turns on at time t3, the electrical drive circuit may provide current (e.g., a main electrical pulse) from a main circuit path and current (e.g., a compensation electrical pulse) from a discharge circuit path at time t3. In this way, and as shown in FIG. 8 by example graph 808, the electrical drive circuit may provide, to the optical load, a current (e.g., a combined electrical pulse) having a short rise time (e.g., the current increases quickly to a maximum current), a constant amplitude, and/or a short fall time.

Figure 9:
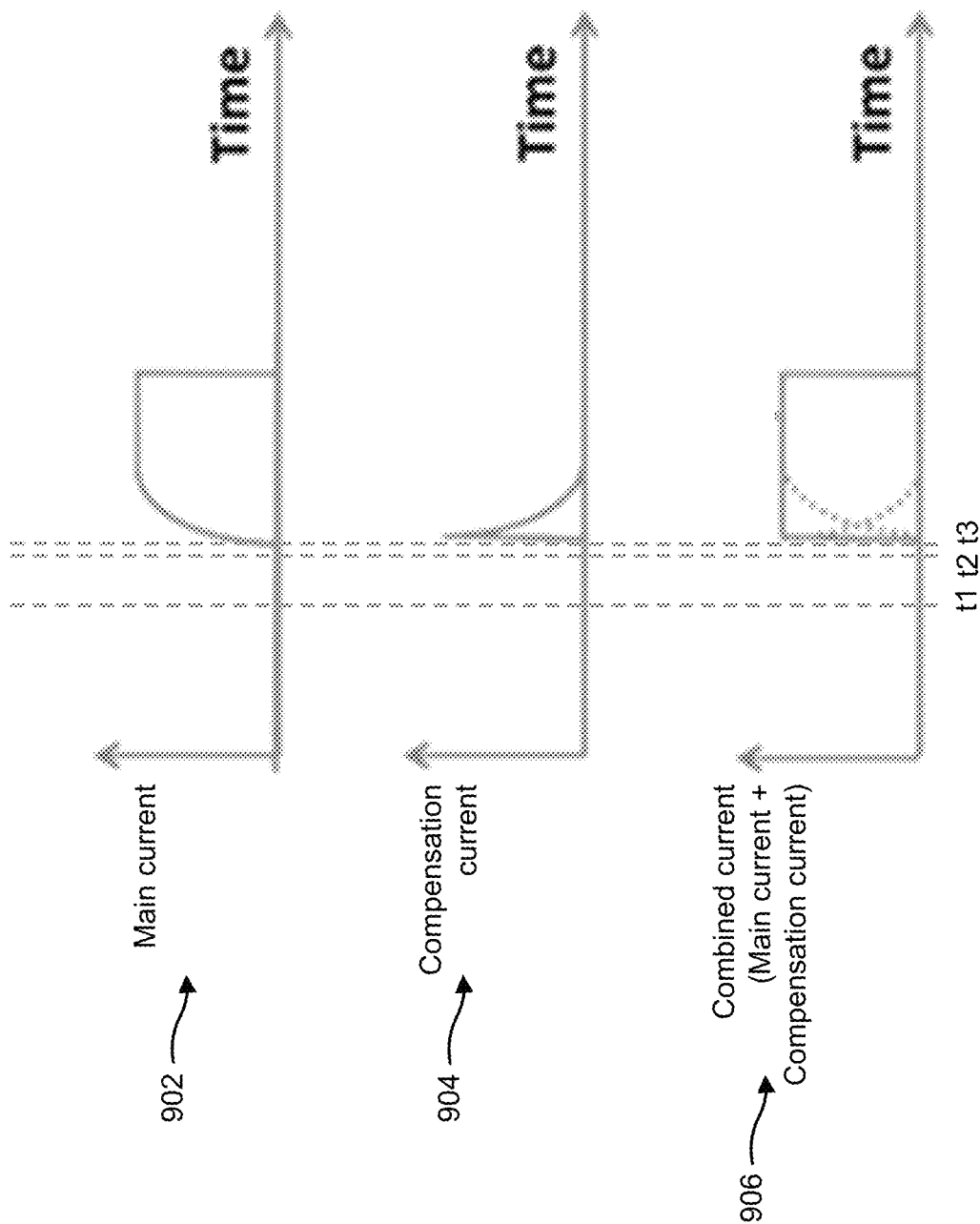
FIG. 9 is a diagram of example graphs plotting currents provided by an example implementation of an electrical drive circuit to an optical load.

FIG. 9 is a diagram of example graphs 902, 904, and 906 plotting currents provided by an example implementation of an electrical drive circuit to an optical load. For example, the electrical drive circuit and optical load may be similar to the electrical drive circuits and the optical loads described herein with respect to FIGS. 1-4. Additionally, or alternatively, the electrical drive circuit may be controlled by a controller (e.g., the controller 502 described herein with respect to FIGS. 5A and 5B) to perform switch timing similar to the switch timing described with respect to FIG. 8. For example, the times t1, t2, and t3, shown in example graphs 902, 904, and 906 may correspond to the times t1, t2, and t3 shown in and described with respect to FIG. 8.

Example graph 902 plots a main current (e.g., of a main electrical pulse) that may be generated by a main circuit path of the electrical drive circuit. As shown in FIG. 9 by example graph 902, the main current may have a long rise time (e.g., the current increases slowly to a maximum current) and a short fall time (e.g., the current decreases quickly from the maximum current to zero).

Example graph 904 plots a compensation current (e.g., of a compensation electrical pulse) that may be generated by a discharging circuit path of the electrical drive circuit. As shown in FIG. 9 by example graph 904, the compensation current may have a short rise time (e.g., the current increases quickly to a maximum current) and a long fall time (e.g., the current decreases slowly from the maximum current to zero).

Example graph 906 plots a combined current (e.g., a combined electrical pulse) that may be provided by the electrical drive circuit to the optical load. For example, the electrical drive circuit may combine the main current and the compensation current to generate the combined current. As shown in FIG. 9 by example graph 906, the combined current may have a short rise time (e.g., corresponding to and/or shorter than the short rise time of the compensation current) and a short fall time (e.g., corresponding to the short fall time of the main current) thus providing a combined current to the optical load that has a rectangularly-shaped pulse. For example, the combined current may have a shorter rise time than the main current and/or a shorter fall time than the compensation current.

As further shown in FIG. 9 by example graph 906, the maximum current of the compensation current may correspond to the maximum current of the main current. As further shown in FIG. 9 by example graph 906, the long fall time of the compensation current may correspond to the long rise time of the main current such that the combined current, during the rise time of the main current and/or the fall time of the compensation current, corresponds to the maximum current of the main current and/or the compensation current. In other words, the compensation current (e.g., of a compensation electrical pulse) may compensate, during a rise time of the main current (e.g., of a main electrical pulse), for the main current such that the combined current provides a constant current during the rise time of the main current.

In this way, the electrical drive circuit may generate and provide, to the optical load, a combined current (e.g., a combined electrical pulse) having a short rise time, a constant amplitude, and a short fall time. By providing such a combined current to the optical load, the electrical drive circuit may drive the optical load to emit an optical pulse having a rectangular shape.

As indicated above, FIGS. 8-9 are provided merely as examples. Other examples may differ from what is described with regard to FIGS. 8-9. For example, rather than controlling the main switch and the compensation switch such that a compensation electrical pulse and a main electrical pulse are combined to provide a combined electrical pulse, a controller may be configured to control the main switch and the compensation switch to generate only the compensation electrical pulse or a series of compensation electrical pulses (e.g., for a 3D-sensing application), where the compensation electrical pulses have a narrow pulse width (e.g., to drive an optical load to emit an optical pulse having a width in a range from 30 picoseconds to 1,000 picoseconds). For example, the controller may control the electrical drive circuit to drive an optical load to emit an optical pulse or a series of optical pulses similar to the optical pulse shown in and described with respect to FIG. 7.

Additionally, or alternatively, for an electrical drive circuit similar to FIG. 1 and/or FIG. 4, the main source may be disconnected, turned off, adjusted to zero voltage, and/or the like, such that the electrical drive circuit does not generate a main electrical pulse and generates only the compensation electrical pulse or a series of compensation electrical pulses (e.g., having a narrow pulse width). In such an implementation, the electrical drive circuit may drive an optical load to emit an optical pulse or a series of optical pulses similar to the optical pulse shown in and described with respect to FIG. 7.

In this way, the electrical drive circuit may be reconfigurable to generate a rectangular-shaped electrical pulse or a narrow electrical pulse for driving an optical load. Being reconfigurable in this way permits the electrical drive circuit and/or a time-of-flight system to be used for different types of applications (e.g., direct time-of-flight, indirect time-of-flight, 3D sensing, LIDAR, and/or the like).

Figure 10:
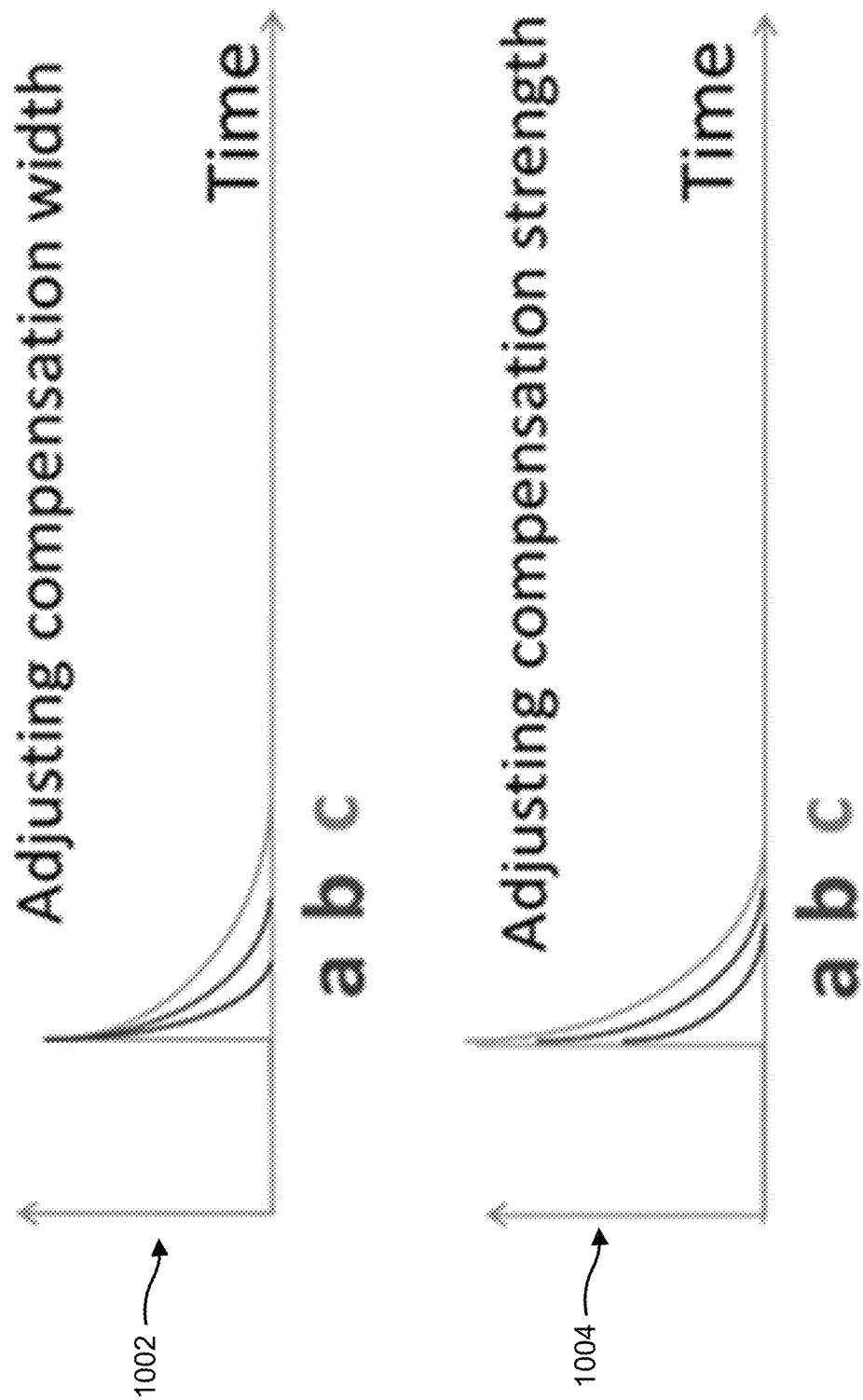
FIG. 10 is a diagram of example graphs plotting shapes of currents provided by an example implementation of an electrical drive circuit to an optical load.

FIG. 10 is a diagram of example graphs 1002 and 1004 plotting shapes of currents provided by an example implementation of an electrical drive circuit to an optical load. For example, the shapes may be for a compensation current similar to the compensation current described with respect to FIG. 9. Additionally, or alternatively, the electrical drive circuit and optical load may be similar to the electrical drive circuits and the optical loads described herein with respect to FIGS. 1-4.

As shown in FIG. 10 by example graph 1002, a compensation width (e.g., a width of a compensation current) may be adjusted to achieve compensation widths a, b, and c. For example, a capacitance of a compensation capacitive element (e.g., the compensation capacitive element 124 of FIG. 1), in the electrical drive circuit, may be adjusted to achieve different compensation widths. In some implementations, a higher capacitance may increase the compensation width, such as for compensation width c. Additionally, or alternatively, a lower capacitance may decrease the compensation width, such as for compensation width a.

As shown in FIG. 10 by example graph 1004, a compensation strength (e.g., a maximum current and/or a fall time of a compensation current) may be adjusted to achieve compensation strengths a, b, and c. For example, a voltage supplied by a source (e.g., the compensation source 122 of FIG. 1) and/or an inductance of an inductive element (e.g., the compensation inductive element 126 of FIG. 1), in the electrical drive circuit, may be adjusted to achieve different compensation strengths. In some implementations, a higher voltage and/or a higher inductance may increase the compensation strength, such as for compensation strength c. Additionally, or alternatively, a lower voltage and/or a lower inductance may decrease the compensation strength, such as for compensation strength a.

By adjusting compensation width and adjusting compensation strength, the electrical drive circuit may achieve a compensation current (e.g., a compensation electrical pulse) that compensates (e.g., complements) a main current (e.g., a main electrical pulse) to achieve a combined current (e.g., a combined electrical pulse) having a rectangular shape. In this way, the electrical drive circuit may be designed to provide a rectangular-shaped combined current to the optical load and drive the optical load to emit a rectangular-shaped optical pulse. Furthermore, by driving the optical load to emit a rectangular-shaped optical pulse, the electrical drive circuit may improve performance of a time-of-flight-based measurement system.

As indicated above, FIG. 10 is provided merely as an example. Other examples may differ from what is described with regard to FIG. 10.

Figure 11:
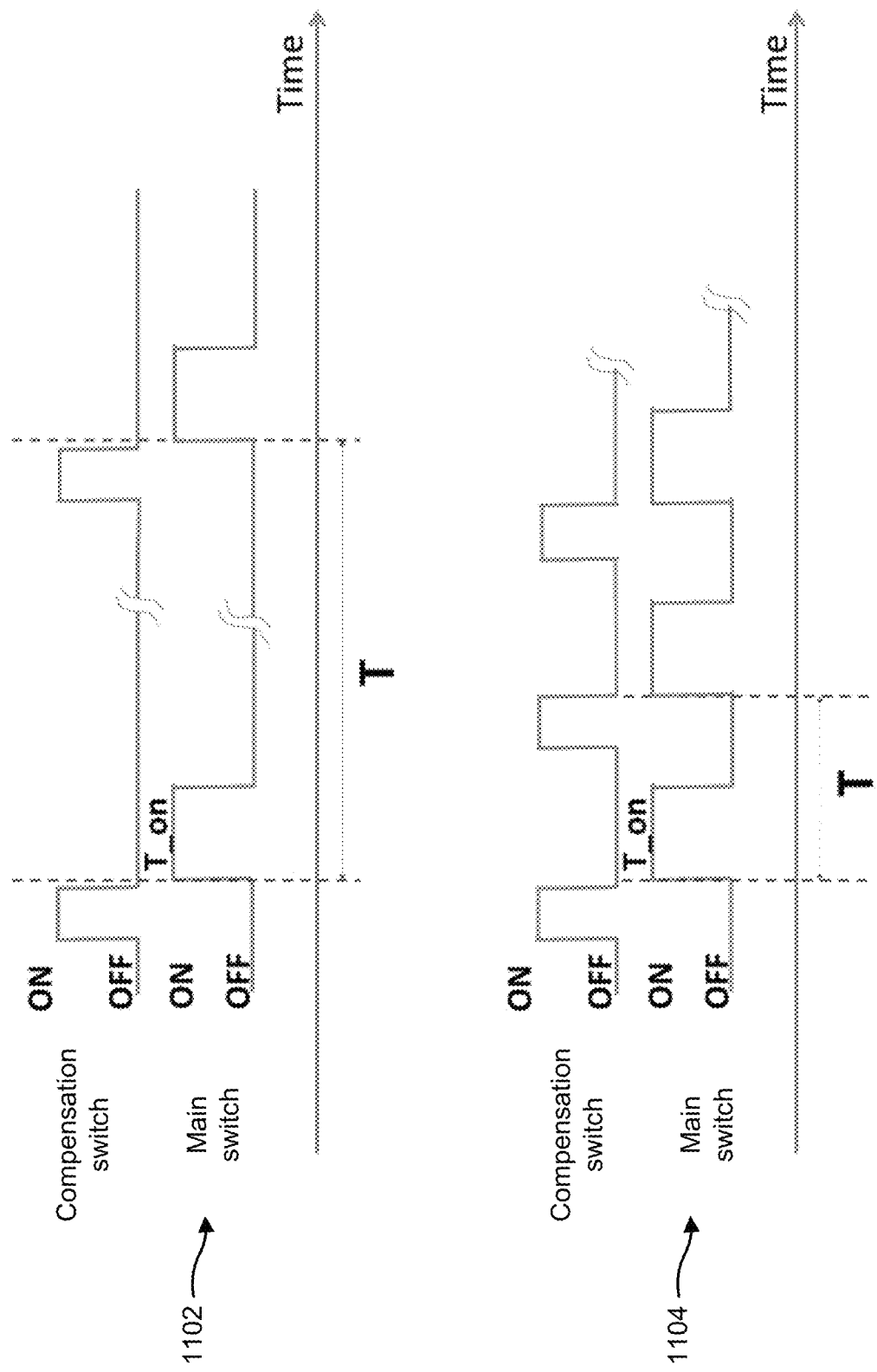
FIG. 11 is a diagram of example graphs plotting examples of switch timing in an example implementation of an electrical drive circuit.

FIG. 11 is a diagram of example graphs 1102 and 1104 plotting examples of switch timing in an example implementation of an electrical drive circuit. For example, the electrical drive circuit may be similar to the electrical drive circuits described herein with respect to FIGS. 1-4. In some implementations, a controller may control (e.g., based on a switch timing) the electrical drive circuit to repeatedly provide an electrical pulse (e.g., a combined electrical pulse) to an optical load.

Example graph 1102 plots example switch timing, for pulse cycles, of a main switch (e.g., the main switch 112 of FIG. 1, the main switch 212 of FIG. 2, the main switch 312 of FIG. 3, the main switch 412 of FIG. 4, and/or the like) and a compensation switch (e.g., the compensation switch 128 of FIG. 1, the compensation switch 228 of FIG. 2, the compensation switch 328 of FIG. 3, the compensation switch of FIG. 4, and/or the like). In some implementations, the switch timing of the main switch and the compensation switch for a pulse may be similar to the switch timing shown in and described with respect to FIGS. 8-9.

As shown in FIG. 11 by example graphs 1102 and 1104, time period T may correspond to a time period between when the main switch turns on for each pulse (e.g., a time period between a beginning of each pulse), and time period T_on may correspond to a time period during which the main switch is on for each pulse. A pulse duty cycle may correspond to a ratio of the time period T_on and the time period T.

As indicated by the broken lines in example graph 1102, the time period T may have an indeterminate length (e.g., a long time period). Accordingly, the pulse duty cycle (T_on/T) may be very low for some applications. For example, the pulse duty cycle may be less than 0.1% (e.g., for a direct time-of-flight application).

As shown in FIG. 11 by example graph 1104, the time period T may also be short. In some implementations, a charging time, when the compensation switch is on, may determine how short the time period T may be. For example, and as shown in FIG. 11 by example graph 1104, the charging time may be less than the time period T_on. Accordingly, the pulse duty cycle (T_on/T) may be very high for some applications.

In some implementations, if a fall time of a first compensation electrical pulse is short as compared to a width of a first main electrical pulse, the compensation switch may turn on to re-charge inductive elements while the main switch is still on. In this way, the electrical drive circuit may re-charge the inductive elements for a second compensation electrical pulse while the first main electrical pulse is being generated, which may permit further reduction in the time period T and an increase in the pulse duty cycle (T_on/T).

Furthermore, if a sum of the fall time of the compensation electrical pulse and a charging time for the inductive elements is less than or equal to the time period T_on, the main switch may turn off for a very short time period before turning on again to generate another main electrical pulse. In other words, a difference between the time period T and the time period T_on can be reduced if the fall time of the compensation electrical pulse and the charging time for the inductive elements are both short enough that the inductive elements can fully discharge and re-charge during the time period T_on. By reducing the difference between the time period T and the time period T_on to nearly zero, the pulse duty cycle (T_on/T) may be nearly 100% (e.g., 99.9%, 99.5%, 99%, 95%, and/or the like). In some implementations, a switching speed of the main switch may limit how high the pulse duty cycle (T_on/T) may be. In some implementations, the electrical drive circuit may have a pulse duty cycle of 50% (e.g., for an indirect time-of-flight application).

In this way, the electrical drive circuit may achieve a pulse duty cycle having a wide range (e.g., in a range from a single pulse to a nearly 100% pulse duty cycle) and the switch timing may be adjusted (e.g., by a controller) to achieve pulse duty cycles for different applications (e.g., direct time-of-flight applications, indirect time-of-flight applications, and/or the like).

As indicated above, FIG. 11 is provided merely as an example. Other examples may differ from what is described with regard to FIG. 11.

Figure 12:
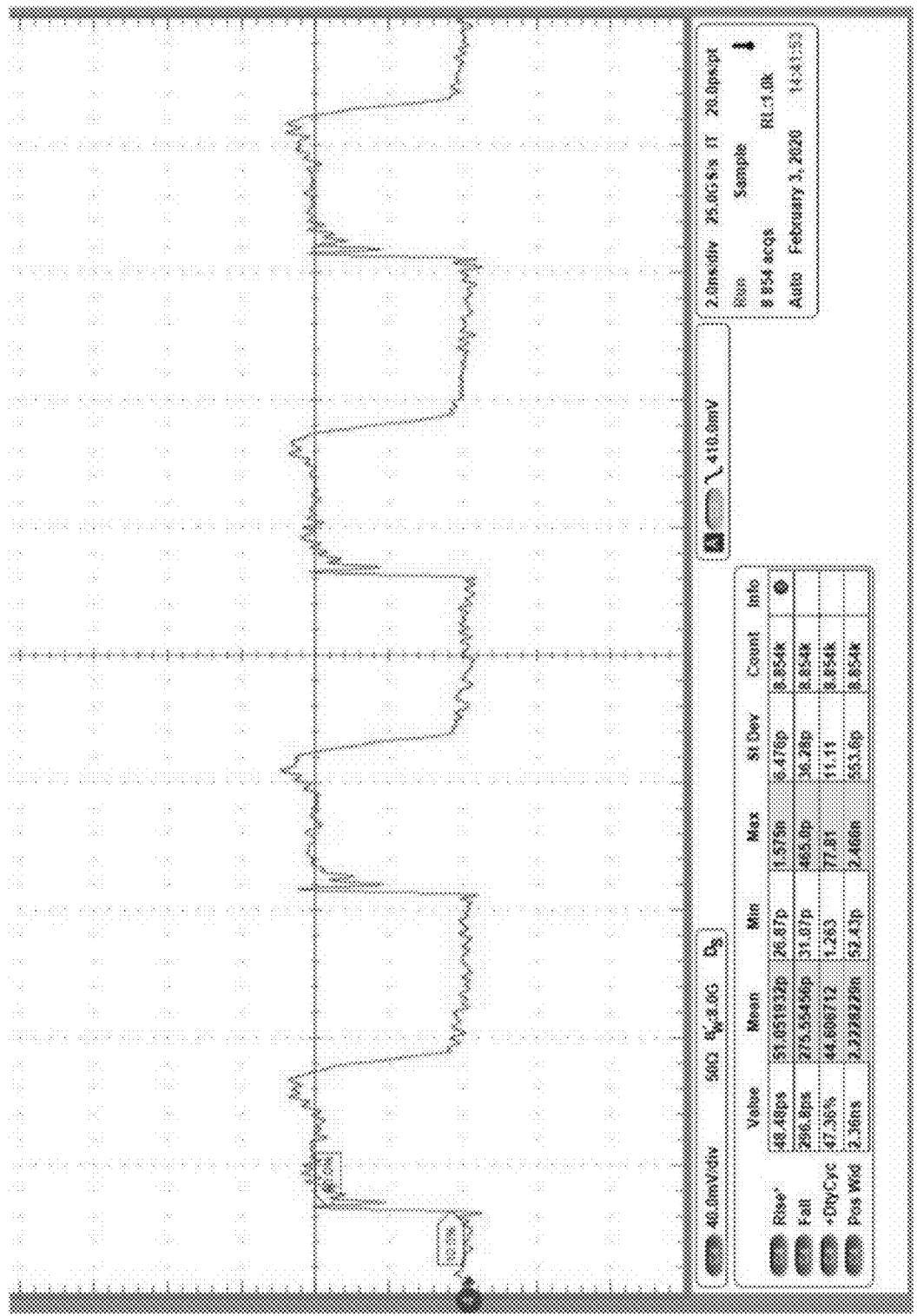
FIG. 12 is a diagram of an example graph plotting voltages from an optical detector receiving an optical signal associated with an example implementation of an electrical drive circuit and optical load described herein.

FIG. 12 is a diagram of an example graph 1200 plotting voltages from an optical detector receiving an optical signal associated with an example implementation of an electrical drive circuit and optical load described herein. For example, the electrical drive circuit and optical load may be similar to the electrical drive circuits and the optical loads described herein with respect to FIGS. 1-4. The example graph 1200 plots an optical signal generated by a VCSEL array in response to electrical signals provided, by the electrical drive circuit, to the VCSEL array, where the electrical signals correspond to a series of combined electrical pulses (e.g., main electrical pulses and compensation electrical pulses) similar to the combined electrical pulses described herein with respect to FIGS. 1-4, 5A, 5B, and 8-11. The VCSEL array may be DC-coupled to a main circuit path (e.g., similar to the main circuit path 102 of FIG. 1 and/or the like) of the electrical drive circuit, and may be AC-coupled to a discharging circuit path (e.g., similar to the discharging circuit path 106 of FIG. 1 and/or the like) of the electrical drive circuit. For example, a main current may be DC-coupled to the VCSEL array, and a compensation current may be AC-coupled to the VCSEL array.

As shown in FIG. 12, the electrical drive circuit may drive the optical load to emit a series of optical pulses (e.g., a pulse train). For example, the optical pulses shown in FIG. 12 may have a rise time of 52 ps, a fall time of 280 ps, and low rippling between the rise time and the fall time (e.g., a constant amplitude), and the electrical drive circuit may drive the optical load at a pulse frequency of 100 megahertz (MHz). In this way, the electrical drive circuit may achieve optical pulses having a rectangular shape. Furthermore, by driving the optical load to emit rectangular-shaped optical pulses, the electrical drive circuit may improve performance of a time-of-flight-based measurement system.

As indicated above, FIG. 12 is provided merely as an example. Other examples may differ from what is described with regard to FIG. 12.

Figure 13:
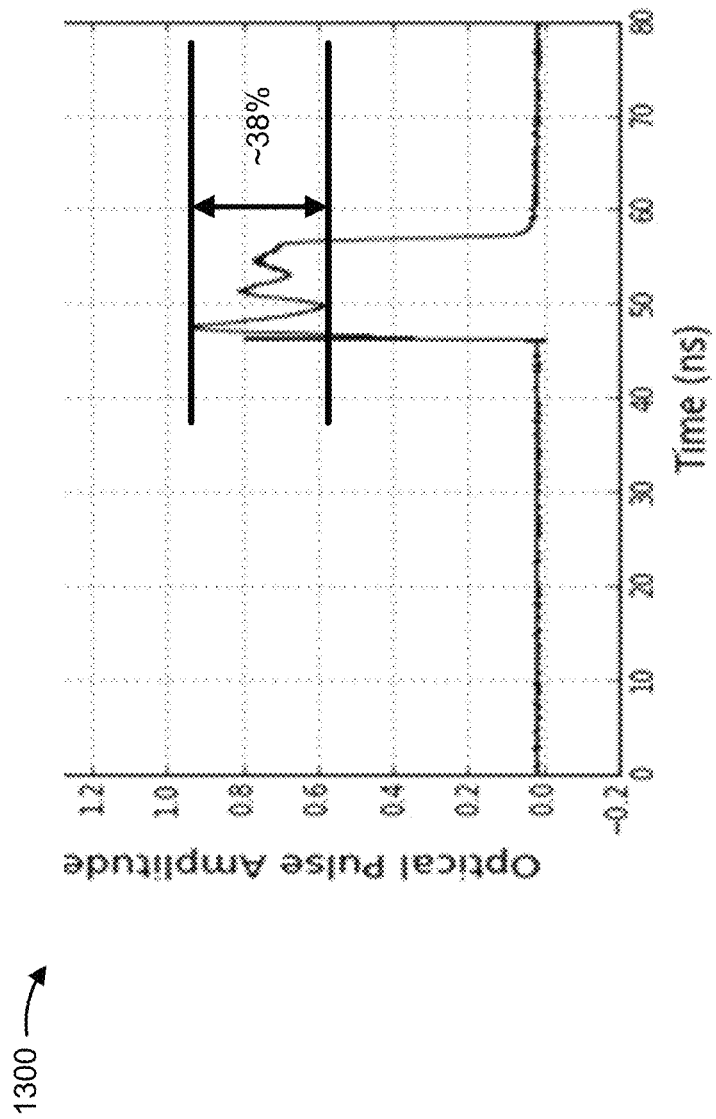
FIG. 13 is a diagram of an example graph plotting voltage from an optical detector receiving an optical signal associated with an electrical drive circuit and an optical load described herein.

FIG. 13 is a diagram of an example graph 1300 plotting voltage from an optical detector receiving an optical signal associated with an electrical drive circuit and an optical load described herein. The example graph 1300 plots optical signals generated by a VCSEL array in response to an electrical signal provided, by the electrical drive circuit, to the VCSEL array.

As shown in FIG. 13, the electrical drive circuit may drive the optical load to emit an optical pulse with high rippling between the rise time and the fall time (e.g., an amplitude that is variable, irregular, inconsistent, inconstant, and/or the like). For example, and as shown in FIG. 13, the optical pulse has a ripple amplitude (e.g., a difference between a peak amplitude and a minimum amplitude between the rise time and the fall time) corresponding to approximately 38% of the peak amplitude. Such rippling may negatively impact performance of a time-of-flight-based measurement system (e.g., a 3D sensing system).

Figure 14:
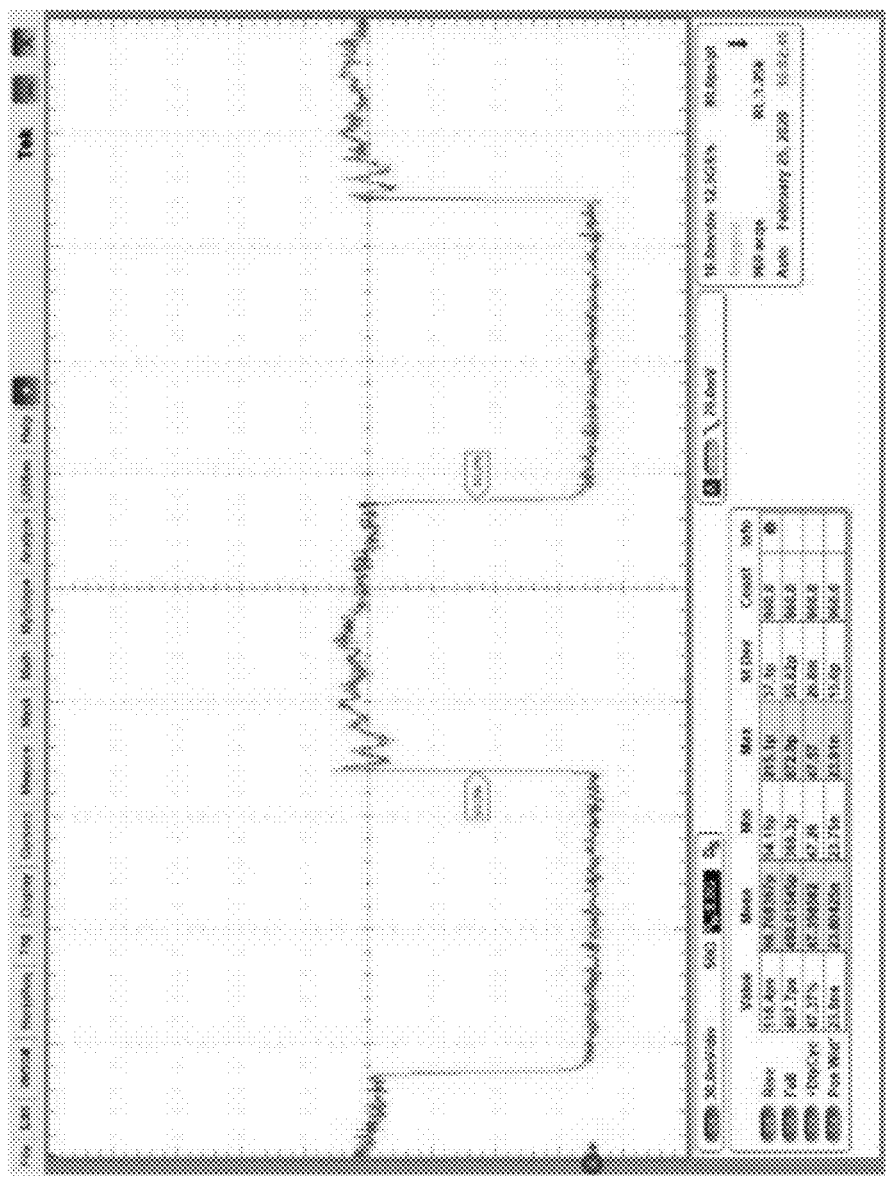
FIGS. 14 and 15 are diagrams of example graphs plotting voltages from an optical detector receiving optical signals associated with example implementations of an electrical drive circuit and optical load described herein.
Figure 15:
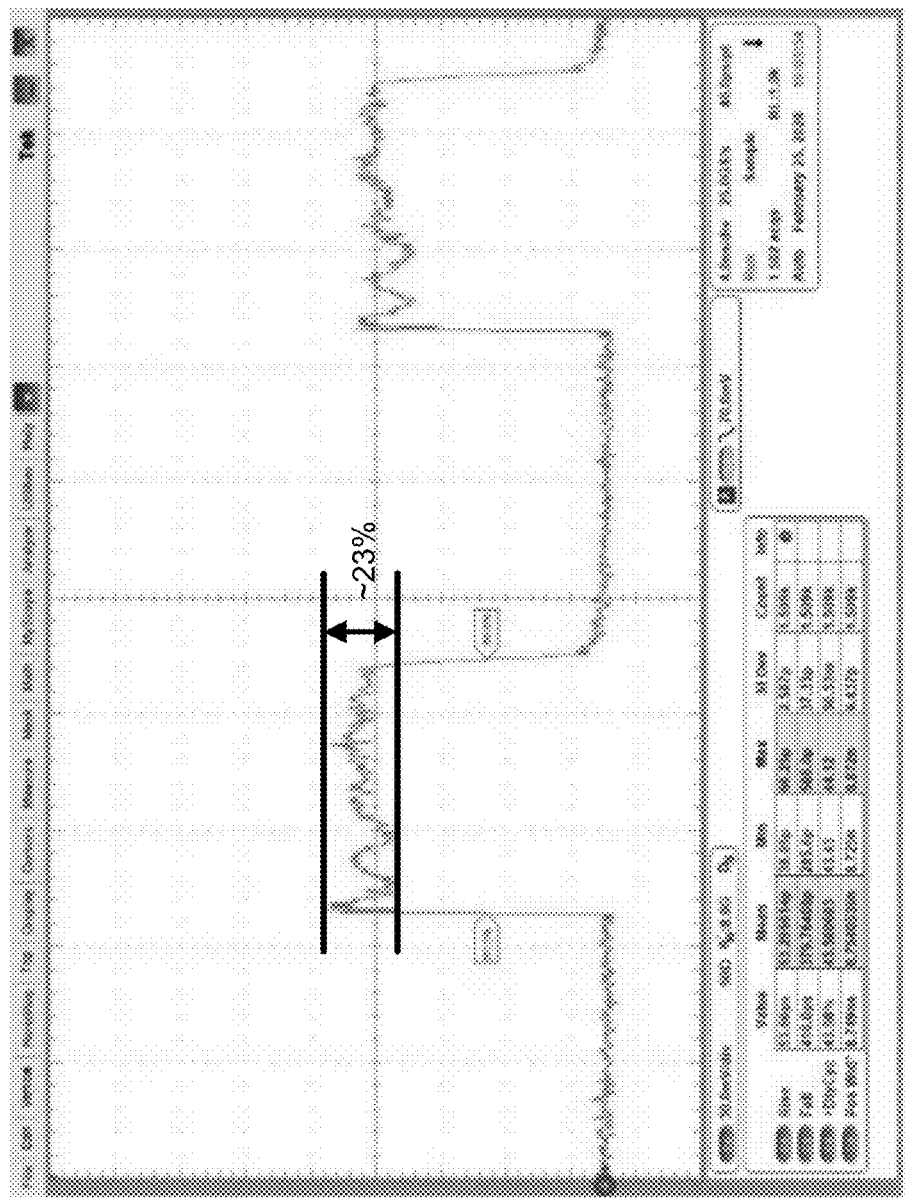

FIGS. 14 and 15 are diagrams of example graphs 1400 and 1500 plotting voltages from an optical detector receiving optical signals associated with example implementations of an electrical drive circuit and optical load described herein. For example, the electrical drive circuit and optical load may be similar to the electrical drive circuits and the optical loads described herein with respect to FIGS. 1-4. The example graphs 1400 and 1500 plot optical signals generated by a VCSEL array in response to electrical signals provided, by the electrical drive circuit, to the VCSEL array, where the electrical signals correspond to a series of combined electrical pulses (e.g., main electrical pulses and compensation electrical pulses) similar to the combined electrical pulses described herein with respect to FIGS. 1-4, 5A, 5B, and 8-11. The VCSEL array may be DC-coupled to a main circuit path (e.g., similar to the main circuit path 102 of FIG. 1 and/or the like) of the electrical drive circuit, and may be AC-coupled to a discharging circuit path (e.g., similar to the discharging circuit path 106 of FIG. 1 and/or the like) of the electrical drive circuit. For example, a main current may be DC-coupled to the VCSEL array, and a compensation current may be AC-coupled to the VCSEL array.

As shown in FIGS. 14 and 15, the electrical drive circuit may drive the optical load to emit a series of optical pulses. For example, the optical pulses shown in FIG. 14 may have a rise time of 97 ps, a fall time of about 40 ps, and low rippling between the rise time and the fall time (e.g., a constant amplitude, a low ripple amplitude, such as less than 25% of peak amplitude, and/or the like), and the electrical drive circuit may drive the optical load at a pulse frequency of 20 MHz. As another example, the optical pulses shown in FIG. 15 may have a rise time of 53 ps, a fall time of about 400 ps, and low rippling between the rise time and the fall time, and the electrical drive circuit may drive the optical load at a pulse frequency of 50 MHz. As also shown in FIG. 15, the optical pulse has a ripple amplitude (e.g., a difference between a peak amplitude and a minimum amplitude between the rise time and the fall time) corresponding to approximately 23% of the peak amplitude.

In this way, the electrical drive circuit may achieve optical pulses having a rectangular shape. Furthermore, by driving the optical load to emit rectangular-shaped optical pulses, the electrical drive circuit may improve performance of a time-of-flight-based measurement system.

As indicated above, FIGS. 14-15 are provided merely as examples. Other examples may differ from what is described with regard to FIGS. 14-15.

Figure 16:
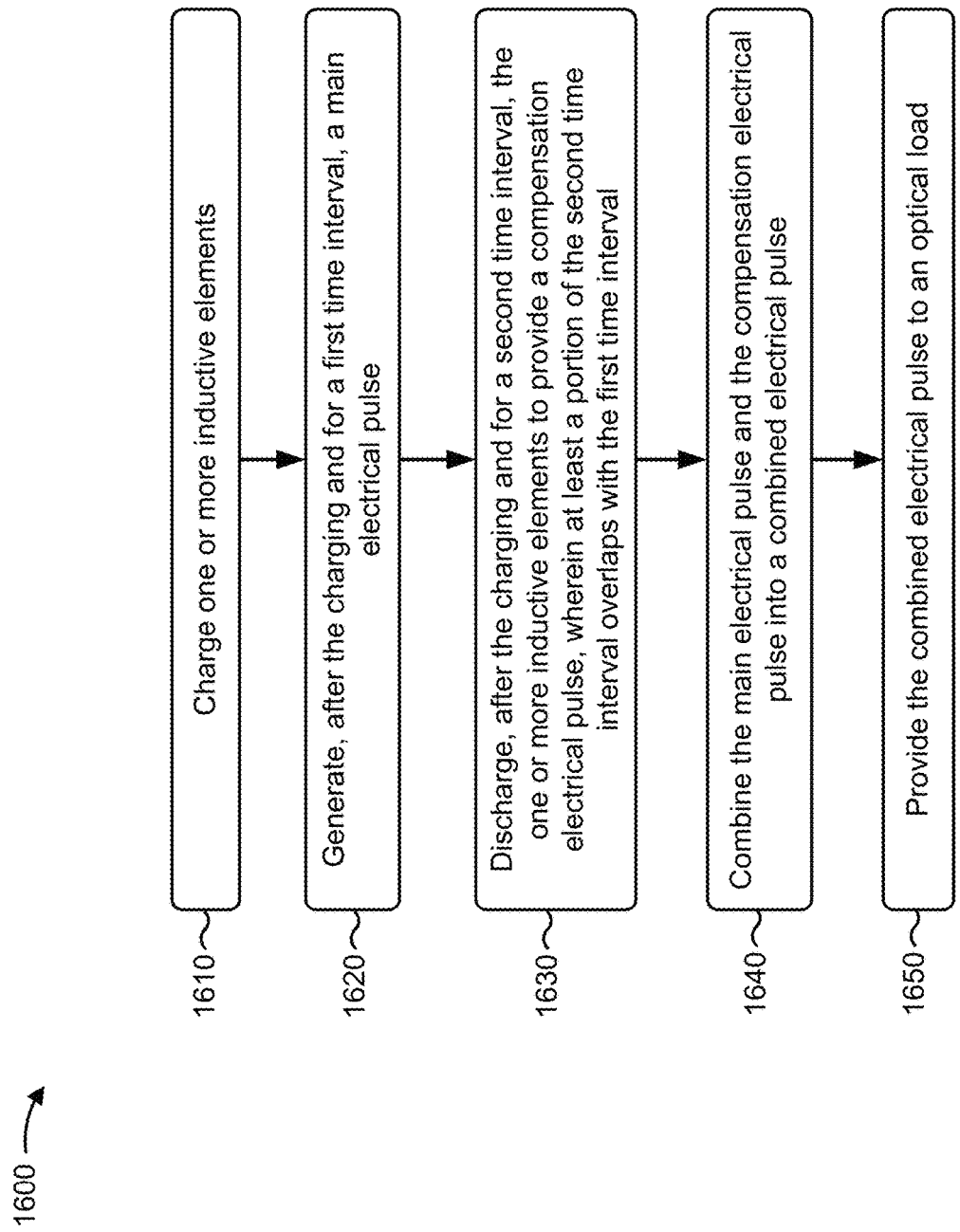
FIG. 16 is a flowchart of an example process for driving an optical load.

FIG. 16 is a flow chart of an example process 1600 for driving an optical load. In some implementations, one or more process blocks of FIG. 16 may be performed by an electrical drive circuit (e.g., an electrical drive circuit as shown in and described with respect to FIGS. 1-4, 5A, 5B, and/or 8-11). In some implementations, one or more process blocks of FIG. 16 may be performed by another device or a group of devices separate from or including the electrical drive circuit, such as an optical device, (e.g., an optical device as shown in and described with respect to FIGS. 1-4, 5A, 5B, and/or 8-11), a time-of-flight-based measurement system (e.g., a direct time-of-flight-based measurement system, an indirect time-of-flight-based measurement system, and/or the like), a 3D sensing system, a LIDAR system, and/or the like. Additionally, or alternatively, one or more process blocks of FIG. 16 may be performed by one or more components of an electrical drive circuit, an optical device, a time-of-flight-based measurement system, a 3D sensing system, a LIDAR system, and/or the like, such as a main circuit path, a charging circuit path, a discharging circuit path, one or more sources, one or more switches, a controller, and/or the like.

As shown in FIG. 16, process 1600 may include charging one or more inductive elements (block 1610). For example, the electrical drive circuit may charge one or more inductive elements, as described above. In some implementations, the electrical drive circuit includes the one or more inductive elements. In some implementations, the electrical drive circuit includes a capacitive element in series between the one or more inductive elements and the optical load. In some implementations, the electrical drive circuit is connected to one or more sources.

As further shown in FIG. 16, process 1600 may include generating, after the charging and for a first time interval, a main electrical pulse (block 1620). For example, the electrical drive circuit may generate, after the charging and for a first time interval, a main electrical pulse, as described above.

As further shown in FIG. 16, process 1600 may include discharging, after the charging and for a second time interval, the one or more inductive elements to provide a compensation electrical pulse, wherein at least a portion of the second time interval overlaps with the first time interval (block 1630). For example, the electrical drive circuit may discharge, after the charging and for a second time interval, the one or more inductive elements to provide a compensation electrical pulse, as described above. In some implementations, at least a portion of the second time interval overlaps with the first time interval. In some implementations, block 1630 may start before block 1620. In some implementations, block 1630 may start before block 1610 finishes.

As further shown in FIG. 16, process 1600 may include combining the main electrical pulse and the compensation electrical pulse into a combined electrical pulse (block 1640). For example, the electrical drive circuit may combine the main electrical pulse and the compensation electrical pulse into a combined electrical pulse, as described above. In some implementations block 1640 may start before block 1620 and/or block 1630 finishes.

As further shown in FIG. 16, process 1600 may include providing the combined electrical pulse to the optical load (block 1650). For example, the electrical drive circuit may provide the combined electrical pulse to the optical load, as described above.

Process 1600 may include additional implementations, such as any single implementation or any combination of implementations described below and/or in connection with one or more other processes described elsewhere herein.

In a first implementation, the combined electrical pulse has a rise time proportional to a rise-time of the compensation electrical pulse.

In a second implementation, alone or in combination with the first implementation, the compensation electrical pulse is a spike pulse.

In a third implementation, alone or in combination with one or more of the first and second implementations, the main electrical pulse has a longer rise time as compared to the compensation electrical pulse, and discharging the compensation electrical pulse compensates for the longer rise time of the main electrical pulse.

In a fourth implementation, alone or in combination with one or more of the first through third implementations, a compensation current provided by the compensation electrical pulse compensates, during a rise time of the main electrical pulse, for a main current of the main electrical pulse such that the combined electrical pulse provides a constant current during the rise time of the main electrical pulse.

In a fifth implementation, alone or in combination with one or more of the first through fourth implementations, the combined electrical pulse has a shorter rise time than the main electrical pulse and a shorter fall time than the compensation electrical pulse.

In a sixth implementation, alone or in combination with one or more of the first through fifth implementations, the second time interval begins before the first time interval.

In a seventh implementation, alone or in combination with one or more of the first through sixth implementations, the second time interval begins at a same time as the first time interval.

In an eighth implementation, alone or in combination with one or more of the first through seventh implementations, the second time interval corresponds to the first time interval.

In a ninth implementation, alone or in combination with one or more of the first through eighth implementations, the second time interval is less than half the first time interval.

In a tenth implementation, alone or in combination with one or more of the first through ninth implementations, the electrical drive circuit includes a charging circuit path for charging the one or more inductive elements, a main circuit path for generating the main electrical pulse, and a discharging circuit path for discharging the compensation electrical pulse.

In an eleventh implementation, alone or in combination with one or more of the first through tenth implementations, charging the one or more inductive elements comprises closing a switch in the electrical drive circuit for a charging time, and discharging the one or more inductive elements to provide the compensation electrical pulse comprises opening, after the charging time, the switch.

Although FIG. 16 shows example blocks of process 1600, in some implementations, process 1600 may include additional blocks, fewer blocks, different blocks, or differently arranged blocks than those depicted in FIG. 16. Additionally, or alternatively, two or more of the blocks of process 1600 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "closer," "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method for driving an optical load, the method comprising:
    charging, by a charging circuit path of an electrical drive circuit, one or more inductive elements,
        wherein the electrical drive circuit includes the one or more inductive elements,
        wherein a discharging circuit path of the electrical drive circuit includes a first capacitive element in series between the one or more inductive elements and the optical load,
        wherein the electrical drive circuit is connected to one or more sources, and
        wherein the charging circuit path includes a second capacitive element in parallel with a source of the one or more sources;
    generating, by the electrical drive circuit, after the charging, and for a first time interval, a main electrical pulse,
        wherein a main current provided by the main electrical pulse is direct-current-coupled (DC-coupled) to the optical load;
    discharging, by the discharging circuit path of the electrical drive circuit, after the charging, and for a second time interval, the one or more inductive elements to provide a compensation electrical pulse,
        wherein at least a portion of the second time interval overlaps with the first time interval, and
        wherein a compensation current provided by the compensation electrical pulse is alternating-current-coupled (AC-coupled) to the optical load;
    combining, by the electrical drive circuit, the main electrical pulse and the compensation electrical pulse into a combined electrical pulse; and
    providing, by the electrical drive circuit, the combined electrical pulse to the optical load.

2. The method of claim 1, wherein the combined electrical pulse has a rise time proportional to a rise-time of the compensation electrical pulse.

3. The method of claim 1, wherein the compensation electrical pulse is a spike pulse.

4. The method of claim 1, wherein the main electrical pulse has a longer rise time as compared to the compensation electrical pulse, and
    wherein discharging the compensation electrical pulse compensates for the longer rise time of the main electrical pulse.

5. The method of claim 1, wherein the compensation current compensates, during a rise time of the main electrical pulse, for the main current such that the combined electrical pulse provides a constant current during the rise time of the main electrical pulse.

6. The method of claim 1, wherein the combined electrical pulse has:
    a shorter rise time than the main electrical pulse; and
    a shorter fall time than the compensation electrical pulse.

7. The method of claim 1, wherein the second time interval begins at a same time as the first time interval.

8. The method of claim 1, wherein the second time interval corresponds to the first time interval.

9. The method of claim 1, wherein the second time interval is less than half the first time interval.

10. The method of claim 1, wherein the electrical drive circuit includes:
    a charging circuit path for charging the one or more inductive elements;
    a main circuit path for generating the main electrical pulse; and
    a discharging circuit path for discharging the compensation electrical pulse.

11. The method of claim 1, wherein charging the one or more inductive elements comprises closing a switch in the electrical drive circuit for a charging time, and
    discharging the one or more inductive elements to provide the compensation electrical pulse comprises opening, after the charging time, the switch.

12. An electrical drive circuit for driving an optical load, the electrical drive circuit comprising:
    a charging circuit path for charging, during a charging time, one or more inductive elements;
    a main circuit path for generating, in a first time interval after the charging time, a main electrical pulse,
        wherein a main current provided by the main electrical pulse is direct-current-coupled (DC-coupled) to the optical load; and
    a discharging circuit path for generating, during a second time interval, a compensation electrical pulse by discharging the one or more inductive elements,
        wherein at least a portion of the second time interval overlaps with the first time interval,
        wherein the discharging circuit path includes a first capacitive element in series between the one or more inductive elements and the optical load, wherein the charging circuit path includes a second capacitive element connected in parallel to a source, and wherein a compensation current provided by the compensation electrical pulse is alternating-current-coupled (AC-coupled) to the optical load; and wherein the electrical drive circuit is to:
combine the main electrical pulse and the compensation electrical pulse into a combined electrical pulse, and
provide the combined electrical pulse to the optical load.

13. The electrical drive circuit of claim 12, wherein the charging circuit path comprises:
the one or more inductive elements;
a switch having an open state and a closed state,
wherein the switch being in the closed state, during the charging time, causes current to charge the one or more inductive elements and the second capacitive element through the charging circuit path.

14. The electrical drive circuit of claim 13, wherein the discharging circuit path comprises:
the one or more inductive elements; and
the second capacitive element; and
wherein the switch transitioning from the closed state to the open state causes the one or more inductive elements to discharge current, during the second time interval, through the discharging circuit path to generate the compensation electrical pulse.

15. The electrical drive circuit of claim 12, further comprising at least one of a rectifier diode, a switch, or a sub-circuit to prevent current from the discharging circuit path from being shunted by a source.

16. The electrical drive circuit of claim 12, wherein the one or more inductive elements comprise a trace having a length and a width to achieve, for the electrical drive circuit, a total inductance such that the compensation electrical pulse has a width and/or an amplitude that compensates the main electrical pulse.

17. An optical device, comprising:
one or more sources;
an optical load to emit light;
an electrical drive circuit connected to the one or more sources and the optical load, wherein the electrical drive circuit comprises:
a charging circuit path for charging one or more inductive elements;
a main circuit path for generating a main electrical pulse,
wherein a main current provided by the main electrical pulse is direct-current-coupled (DC-coupled) to the optical load; and
a discharging circuit path for generating a compensation electrical pulse by discharging the one or more inductive elements,
wherein a compensation current provided by the compensation electrical pulse is alternating-current-coupled (AC-coupled) to the optical load, and wherein the discharging circuit path includes a first capacitive element in series between the one or more inductive elements and the optical load, wherein the charging circuit path includes a second capacitive element in parallel with a source of the one or more sources, and wherein the electrical drive circuit is to:
combine the main electrical pulse and the compensation electrical pulse into a combined electrical pulse, and
provide the combined electrical pulse to the optical load; and a controller to control the electrical drive circuit to provide the combined electrical pulse to the optical load by:
causing the charging circuit path to charge the one or more inductive elements for a charging time;
causing the main circuit path to generate the main electrical pulse for a first time interval; and
causing the discharging circuit path to generate the compensation electrical pulse for a second time interval,
wherein at least a portion of the second time interval overlaps with the first time interval; and
wherein the optical load is to emit, in response to the combined electrical pulse, an optical pulse.

18. The optical device of claim 17, wherein the optical load is at least one of an array of one or more light-emitting diodes, an array of one or more laser diodes, an array of one or more semiconductor laser diodes, or an array of one or more vertical-cavity surface-emitting lasers.

19. The optical device of claim 17, wherein causing the charging circuit path to charge the one or more inductive elements comprises causing a switch to close.

20. The optical device of claim 19, wherein causing the discharging circuit path to generate the compensation electrical pulse comprises causing the switch to open.

21. The optical device of claim 17, wherein the controller is to control the electrical drive circuit to repeatedly, at a pulse frequency, provide the combined electrical pulse to the optical load.

22. The optical device of claim 21, wherein the pulse frequency is in a range from 20 megahertz to 100 megahertz.

23. The optical device of claim 17, wherein the first capacitive element is a direct-current-blocking capacitor.

24. The optical device of claim 17, wherein the optical pulse has a rise time of less than 100 picoseconds.

25. The optical device of claim 17, wherein the charging circuit path comprises:
the one or more inductive elements; and
a switch having an open state and a closed state,
wherein the switch being in the closed state, during the charging time, causes current to charge the one or more inductive elements and the second capacitive element through the charging circuit path.

* * * * *

UNITED STATES PATENT AND TRADEMARK OFFICE
CERTIFICATE OF CORRECTION

PATENT NO.         : 11,870,215 B2
APPLICATION NO.    : 16/912338
DATED              : January 9, 2024
INVENTOR(S)        : Hao Huang et al.

It is certified that error appears in the above-identified patent and that said Letters Patent is hereby corrected as shown below:

In the Claims

In Claim 13, Column 27, Line 15, "the one or more inductive elements;" should be changed to -- the one or more inductive elements; and --.

Signed and Sealed this
Fifth Day of March, 2024

Katherine Kelly Vidal
*Director of the United States Patent and Trademark Office*